US008992686B2

(12) United States Patent
Gomi et al.

(10) Patent No.: US 8,992,686 B2
(45) Date of Patent: Mar. 31, 2015

(54) MOUNTING TABLE STRUCTURE, FILM FORMING APPARATUS AND RAW MATERIAL RECOVERY METHOD

(75) Inventors: Atsushi Gomi, Nirasaki (JP); Yasushi Mizusawa, Nirasaki (JP); Tatsuo Hatano, Nirasaki (JP); Masamichi Hara, Nirasaki (JP); Kaoru Yamamoto, Nirasaki (JP); Satoshi Taga, Nirasaki (JP); Chiaki Yasumuro, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 21 days.

(21) Appl. No.: 13/225,049

(22) Filed: Sep. 2, 2011

(65) Prior Publication Data
US 2012/0055403 A1 Mar. 8, 2012

Related U.S. Application Data

(63) Continuation of application No. PCT/JP2010/053458, filed on Mar. 3, 2010.

(30) Foreign Application Priority Data

Mar. 3, 2009 (JP) .................................. 2009-049925

(51) Int. Cl.
*C23C 16/50* (2006.01)
*C23C 16/00* (2006.01)
(Continued)

(52) U.S. Cl.
CPC ...... *H01L 21/68785* (2013.01); *C23C 16/4404* (2013.01); *C23C 16/4412* (2013.01); *C23C 16/4585* (2013.01); *C23C 16/4586* (2013.01); *H01L 21/67109* (2013.01)
USPC .. 118/724; 118/728; 156/345.52; 156/345.53

(58) Field of Classification Search
USPC ......... 118/715, 728–733; 156/345.51–345.55
See application file for complete search history.

(56) References Cited

U.S. PATENT DOCUMENTS 4,600,489 A * 7/1986 Lefkow .................... 204/192.38
5,376,213 A * 12/1994 Ueda et al. ............... 156/345.27
(Continued)

FOREIGN PATENT DOCUMENTS

JP  6-132386   5/1994
JP  7-22501    1/1995
(Continued)

OTHER PUBLICATIONS

International Search Report mailed Apr. 6, 2010 in PCT/JP2010/053458 filed Mar. 3, 2010 (with English Translation).
(Continued)

*Primary Examiner* — Maureen Gramaglia
*Assistant Examiner* — Tiffany Nuckols
(74) *Attorney, Agent, or Firm* — Oblon, McClelland, Maier & Neustadt, L.L.P.

(57) ABSTRACT

Provided is a mounting table structure for use in forming a thin film on a surface of a target object mounted on the mounting table structure by using a raw material gas including an organic metal compound in a processing chamber. The mounting table structure includes: a mounting table main body which mounts thereon the target object and has therein a heater; and a base which supports the mounting table main body while surrounding a side surface and a bottom surface of the mounting table main body, the base having therein a coolant path where a coolant flows therethrough and being maintained at a temperature higher than the solidification temperature or the liquefaction temperature of the raw material gas, but lower than the decomposition temperature of the raw material gas.

41 Claims, 16 Drawing Sheets

(51) Int. Cl.
*C23F 1/00* (2006.01)
*H01L 21/306* (2006.01)
*H01L 21/687* (2006.01)
*C23C 16/44* (2006.01)
*C23C 16/458* (2006.01)
*H01L 21/67* (2006.01)

(56) References Cited

U.S. PATENT DOCUMENTS

| | | | | |
|---|---|---|---|---|
| 5,411,624 | A * | 5/1995 | Hirano et al. | 156/345.46 |
| 5,421,401 | A * | 6/1995 | Sherstinsky et al. | 165/80.2 |
| 5,520,142 | A * | 5/1996 | Ikeda et al. | 118/733 |
| 5,529,657 | A * | 6/1996 | Ishii | 156/345.26 |
| 5,556,500 | A * | 9/1996 | Hasegawa et al. | 156/345.27 |
| 5,571,366 | A * | 11/1996 | Ishii et al. | 156/345.26 |
| 5,810,931 | A * | 9/1998 | Stevens et al. | 118/721 |
| 5,958,265 | A * | 9/1999 | Ogahara | 219/121.43 |
| 6,079,356 | A * | 6/2000 | Umotoy et al. | 118/723 E |
| 6,123,864 | A * | 9/2000 | Tam et al. | 216/67 |
| 6,159,299 | A * | 12/2000 | Koai et al. | 118/715 |
| 6,162,336 | A * | 12/2000 | Lee | 204/298.15 |
| 6,179,924 | B1 * | 1/2001 | Zhao et al. | 118/725 |
| 6,210,486 | B1 * | 4/2001 | Mizukami et al. | 118/728 |
| 6,263,829 | B1 * | 7/2001 | Schneider et al. | 118/723 I |
| 6,464,794 | B1 * | 10/2002 | Park et al. | 118/728 |
| 6,475,336 | B1 * | 11/2002 | Hubacek | 156/345.51 |
| 6,494,955 | B1 * | 12/2002 | Lei et al. | 118/715 |
| 6,511,543 | B1 * | 1/2003 | Stauss et al. | 118/503 |
| 6,531,686 | B2 * | 3/2003 | Park | 219/444.1 |
| 6,558,508 | B1 * | 5/2003 | Kawakami | 156/345.51 |
| 6,610,170 | B2 * | 8/2003 | Tamura et al. | 156/345.51 |
| 6,646,233 | B2 * | 11/2003 | Kanno et al. | 219/390 |
| 6,669,783 | B2 * | 12/2003 | Sexton et al. | 118/728 |
| 6,676,804 | B1 * | 1/2004 | Koshimizu et al. | 156/345.51 |
| 6,723,202 | B2 * | 4/2004 | Nagaiwa et al. | 156/345.43 |
| 6,828,243 | B2 * | 12/2004 | Denpoh | 438/706 |
| 6,896,765 | B2 * | 5/2005 | Steger | 156/345.51 |
| 7,001,482 | B2 * | 2/2006 | Landis et al. | 156/345.55 |
| 7,244,336 | B2 * | 7/2007 | Fischer et al. | 156/345.51 |
| 7,274,006 | B2 * | 9/2007 | Okajima et al. | 219/465.1 |
| 7,335,278 | B2 * | 2/2008 | Koshimizu et al. | 156/345.53 |
| 7,524,397 | B2 * | 4/2009 | Hao et al. | 156/345.51 |
| 7,794,788 | B2 * | 9/2010 | Suzuki | 427/255.28 |
| 7,837,827 | B2 * | 11/2010 | Dhindsa et al. | 156/345.51 |
| 7,837,828 | B2 * | 11/2010 | Ikeda et al. | 156/345.53 |
| 7,850,174 | B2 * | 12/2010 | Endoh et al. | 279/128 |
| 2001/0036509 | A1 | 11/2001 | Kitada et al. | |
| 2002/0029745 | A1 * | 3/2002 | Nagaiwa et al. | 118/723 E |
| 2002/0144655 | A1 * | 10/2002 | Chiang et al. | 118/715 |
| 2004/0081607 | A1 | 4/2004 | Hasegawa | |
| 2004/0261946 | A1 * | 12/2004 | Endoh et al. | 156/345.15 |
| 2005/0042881 | A1 * | 2/2005 | Nishimoto et al. | 438/710 |
| 2005/0059246 | A1 | 3/2005 | Yamada et al. | |
| 2005/0133164 | A1 * | 6/2005 | Fischer et al. | 156/345.51 |
| 2005/0155552 | A1 * | 7/2005 | Kitada et al. | 118/715 |
| 2005/0172904 | A1 * | 8/2005 | Koshimizu et al. | 118/728 |
| 2006/0005930 | A1 * | 1/2006 | Ikeda et al. | 156/345.51 |
| 2007/0051472 | A1 * | 3/2007 | Murakami et al. | 156/345.51 |
| 2007/0169891 | A1 * | 7/2007 | Koshiishi et al. | 156/345.47 |
| 2007/0283884 | A1 * | 12/2007 | Tiller et al. | 118/715 |
| 2007/0283891 | A1 * | 12/2007 | Okayama | 118/728 |
| 2009/0084500 | A1 * | 4/2009 | Sawayama et al. | 156/345.1 |
| 2009/0200269 | A1 * | 8/2009 | Kadkhodayan et al. | 216/71 |
| 2010/0065216 | A1 * | 3/2010 | Tiller et al. | 156/345.51 |
| 2011/0021031 | A1 * | 1/2011 | Taylor et al. | 438/724 |
| 2011/0092070 | A1 | 4/2011 | Hara et al. | |

FOREIGN PATENT DOCUMENTS

| | | |
|---|---|---|
| JP | 9-186095 | 7/1997 |
| JP | 2001-214272 | 8/2001 |
| JP | 2001-342566 | 12/2001 |
| JP | 2004-289035 A | 10/2004 |
| JP | 2005-54252 A | 3/2005 |
| JP | 2006-216864 | 8/2006 |
| JP | 2009-239104 | 10/2009 |
| KR | 10-2000-0062779 | 10/2000 |
| KR | 10-2004-0037079 | 5/2004 |
| KR | 10-2004-0093739 | 11/2004 |

OTHER PUBLICATIONS

Office Action issued Mar. 27, 2013, in Korean Patent Application No. 10-2011-7020855.

* cited by examiner

MOUNTING TABLE STRUCTURE, FILM FORMING APPARATUS AND RAW MATERIAL RECOVERY METHOD

This application is a Continuation Application of PCT International Application No. PCT/JP2010/053458 filed on Mar. 3, 2010, which designated the United States.

FIELD OF THE INVENTION

The present invention relates to a film forming apparatus for forming a film on a surface of a target object such as a semiconductor wafer or the like by using a raw material gas, a mounting table structure used therefor, and a raw material recovery method for recovering a raw material from an exhaust gas and/or from a surface of a component in a processing chamber.

BACKGROUND OF THE INVENTION

Generally, in order to form an integrated circuit or a logic device, a process for forming a desired thin film on a surface of a semiconductor wafer, an LCD substrate or the like, or a process for etching such thin film in a desired pattern is repeatedly carried out.

For example, in a film forming process performed by a film forming apparatus, a thin film of silicon, a thin film of a silicon oxide or a silicon nitride, a thin film of a metal, a thin film of a metal oxide or a metal nitride, or the like is formed on a surface of a target object to be processed by having a predetermined processing gas (raw material gas) to react in a processing chamber. This thin film is deposited on the surface of the target object and is also adhered as an unnecessary adhesion film on surfaces of components in the processing chamber.

For example, FIG. 16 is a schematic diagram showing a part of a conventional mounting table structure provided in a film forming apparatus. A mounting table 2 made of, e.g., ceramic, is supported by a support 4 standing upright on a bottom portion of a chamber. A heater 6 is provided in the mounting table 2 to heat a semiconductor wafer W mounted thereon. Further, a ring-shaped cover ring 8 is provided around the periphery of the top surface of the mounting table 2 in order to prevent film formation on an end surface of the semiconductor wafer W. During the film formation, a temperature of the semiconductor wafer W is increased and, also, a temperature of a part of the side surface or the bottom surface of the mounting table 2 or the cover ring 8 as an in-chamber component is increased. Therefore, an unnecessary adhesion film 10 is deposited thereon. As the film formation reaction proceeds, residual reaction by-products are generated and exhausted together with an exhaust gas, and the unreacted processing gas remained therein without having reaction is also exhausted.

If the unreacted processing gas and/or the reaction by-product in the exhaust gas are directly discharged to the atmosphere, it causes environmental pollution or the like. Generally, in order to collect and remove the unreacted processing gas and/or the reaction by-product contained in the exhaust gas, a trap mechanism is installed at a gas exhaust system extending from a processing chamber. The unnecessary adhesion films adhered on the above-described components are removed and discarded by performing at regular intervals, e.g., wet cleaning in a state where the components are separated from the processing chamber or dry cleaning using a chloride- or a fluorine-based etching gas.

Various structures have been proposed for the trap mechanism in accordance with characteristics of a reaction by-product or the like to be collected and removed. For example, when a reaction by-product that is condensed (liquefaction) and solidified at a room temperature needs to be removed, the trap mechanism has a configuration in which a plurality of fins is provided in a housing having an inlet port and an outlet port of an exhaust gas. In this case, the fins are sequentially arranged along a direction in which the exhaust gas flows, so that the reaction by-product or the like in the exhaust gas is adhered to the surfaces of the fins and collected while the exhaust gas is passing through the fins. The collection efficiency can be increased by cooling the fins by a coolant or the like (see, e.g., Japanese Patent Application Publication No. 2001-214272).

Recently, in order to reduce wiring resistance or contact resistance, a thin film is formed by a film forming apparatus by using a raw material (source gas) of an organic metal compound containing a noble metal such as silver, gold, ruthenium or the like. In this case, there is proposed a recovery method for recovering a by-product containing an unreacted raw material by cooling and condensing an exhaust gas and for obtaining the unreacted raw material by purifying the by-product (see, e.g., Japanese Patent Application Publication No. 2001-342566).

However, in the above conventional film forming apparatus, dry cleaning using a chloride- or a fluorine-based etching gas is performed at regular intervals or irregular intervals. Thus, the unreacted raw material gas collected in the gas exhaust system during the film formation may be exposed to the etching gas to thereby be deteriorated. Accordingly, time and cost are required to perform the purifying process for recovering the raw material, or the collected raw material needs to be discharged from the gas exhaust system before the dry cleaning, which is complicated. Although a bypass line for bypassing the trap mechanism may be provided, the equipment becomes complicated.

In addition, since a thin film is deposited unnecessarily on the surfaces of the components in the processing chamber other than the semiconductor wafer as described above, the raw material gas is wasted, thereby decreasing the yield of the raw material. Especially, recently, a high-cost metal such as Ru (ruthenium) or the like is used as a film forming material, so that a method for effectively recovering a raw material or a metal contained in the raw material at a low cost is required.

SUMMARY OF THE INVENTION

In view of the above, the present invention provides a mounting table structure, a film forming apparatus and a raw material recovery method, capable of effectively recovering a raw material or a metal contained in the raw material at a low cost by reducing the frequency of a dry cleaning process or omitting the dry cleaning process altogether.

In accordance with an embodiment of the present invention, there is provided a mounting table structure for use in forming a thin film on the surface of a target object mounted on the mounting table structure by using a raw material gas containing an organic metal compound in a vacuum evacuable processing chamber, the mounting table structure including: a mounting table main body which mounts thereon the target object and has a heater therein; and a base which supports the mounting table main body while surrounding a side surface and a bottom surface of the mounting table main body, the base having therein a coolant path where a coolant flows therethrough and being maintained at a temperature higher than a solidification temperature or a liquefaction temperature of the raw material gas, but lower than a decomposition temperature of the raw material gas.

With such configuration, the deposition of an unnecessary thin film on the base is suppressed, and a thin film can be formed only on a desired portion, i.e., the surface of the target object. Accordingly, the frequency of the dry cleaning process can be decreased, or the dry cleaning process can be omitted. Further, the raw material or the metal contained in the raw material can be effectively recovered at a low cost.

In accordance with another embodiment of the present invention, there is provided a mounting table structure for use in forming a thin film on a surface of a target object mounted on the mounting table structure by using a raw material gas containing an organic metal compound in a vacuum evacuable processing chamber, the mounting table structure including: a mounting table main body which mounts thereon the target object and has therein a heater; a base, made of a metal, which supports the mounting table main body and has therein a coolant path where a coolant flows therethrough; and a peripheral component which is detachably provided at an outer peripheral side of the mounting table main body so as to surround the mounting table main body and is controlled to a temperature equal to or higher than the decomposition temperature of the raw material gas during the thin film formation.

With such configuration, the raw material gas that does not contribute to the film formation on the target object may be thermally decomposed by the heated peripheral component and then deposited as an unnecessary thin film on the surface of the peripheral component. By separating the peripheral component later, the metal contained in the raw material can be effectively recovered from the peripheral component at a low cost. Further, the load of the gas exhaust system can be reduced.

In accordance with still another embodiment of the present invention, there is provided a film forming apparatus for performing a film forming process for forming a thin film on a surface of a target object by using a raw material gas containing an organic metal compound, the film forming apparatus including a vacuum evacuable processing chamber; the mounting table main body described above, for mounting thereon the target object; a gas introduction unit for introducing a gas into the processing chamber; a raw material gas supply system, connected to the gas introduction unit, for supplying the raw material gas; a gas exhaust system for exhausting the atmosphere in the processing chamber; and a trap mechanism for collecting and recovering an unreacted raw material gas from the exhaust gas flowing in the gas exhaust system.

In this configuration, the unreacted raw material gas in the exhaust gas is collected by the trap mechanism, so that the unnecessary consumption of the raw material is prevented. Further, it is possible to reduce the frequency of the dry cleaning process or omit the dry cleaning process. Moreover, the raw material can be effectively recovered at a low cost.

In accordance with still another embodiment of the present invention, there is provided a raw material recovery method in a film forming apparatus for forming a thin film on a surface of a target object mounted on a mounting table structure in a vacuum evacuable processing chamber by using a raw material gas containing an organic metal compound, the raw material recovery method including: a film forming step of forming a thin film on the surface of the target object while heating the target object by the mounting table structure and maintaining a temperature of a component that is not in direct contact with the target objet at a level higher than the solidification temperature or the liquefaction temperature of the raw material gas, but lower than the decomposition temperature of the raw material; a recovery step of recovering a raw material by solidifying or liquefying an unreacted raw material gas contained in the exhaust gas discharged from the processing chamber.

With such configuration, the raw material is recovered from the unreacted raw material gas in the exhaust gas, so that the unnecessary consumption of the raw material is prevented. This makes it possible to reduce the frequency of the dry cleaning process or omit the dry cleaning process. Further, the raw material can be effectively recovered at a low cost.

In accordance with still another embodiment of the present invention, there is provided a raw material recovery method in a film forming apparatus for forming a thin film on a surface of a target object mounted on a mounting table structure in a vacuum evacuable processing chamber by using a raw material gas containing an organic metal compound, the raw material recovery method including: a film forming step of forming a thin film on the surface of the target object while heating the target object by the mounting table structure and maintaining a temperature of a peripheral component provided around a component in direct contact with the target objet at a level equal to or higher than the decomposition temperature of the raw material gas; a recovery step of recovering a raw material by solidifying or liquefying an unreacted raw material gas contained in the exhaust gas discharged from the processing chamber.

With such configuration, the raw material is recovered from the unreacted raw material gas in the exhaust gas, so that the unnecessary consumption of the raw material is prevented. Especially, the raw material gas that does not contribute to the film formation is thermally decomposed and deposited as an unnecessary thin film on the surface of the peripheral component. By recovering this later, the recovering efficiency of the raw material is increased.

In accordance with still another embodiment of the present invention, there is provided a raw material recovery method in a film forming apparatus for forming a thin film on a surface of a target object mounted on a mounting table structure in a vacuum evacuable processing chamber by using a raw material gas containing an organic metal compound, the raw material recovery method including: a coating film forming step of forming a coating film on a component detachably provided at the mounting table structure; an attaching step of forming a mounting table structure by attaching the component having the coating film to the mounting table structure; a film forming step of forming a thin film on the surface of the target object mounted on the mounting table structure having the component; a separating step of separating the component from the mounting table after the film forming step; a removing step of removing the thin film adhered on the component together with the coating film; and a recovery step of recovering a metal contained in the raw material from the removed thin film.

With such configuration, the metal contained in the raw material can be effectively recovered at a low cost.

In accordance with still another embodiment of the present invention, there is provided a raw material recovery method in a film forming apparatus for forming a thin film on a surface of a target object mounted on a mounting table structure in a vacuum evacuable processing chamber by using a raw material gas containing an organic metal compound, the raw material recovery method including: an attaching step of forming the mounting table structure by attaching a peripheral component to an outer peripheral side of a mounting table main body having a heater so as to surround the mounting table main body; a film forming step of forming a thin film on the surface of the target object mounted on the mounting table structure to which the peripheral component is attached, while maintaining a temperature of the target object and a temperature of the peripheral component at a level equal to or higher than the decomposition temperature of the raw material gas; a separating step of separating the peripheral component from the mounting table structure after the film forming step; a removing step of removing the thin film adhered on the peripheral component; and a recovery step of recovering a metal contained in the raw material from the removed thin film.

With such configuration, the metal contained in the raw material can be recovered from the unnecessary thin film deposited on the surface of the peripheral component at a low cost, and the load of the gas exhaust system can be reduced.

DETAILED DESCRIPTION OF THE EMBODIMENTS

Hereinafter, embodiments of a mounting table structure, a film forming apparatus and a raw material recovery method of the present invention will be described in detail with reference to the accompanying drawings.

First Embodiment of a Film Forming Apparatus

Figure 1:
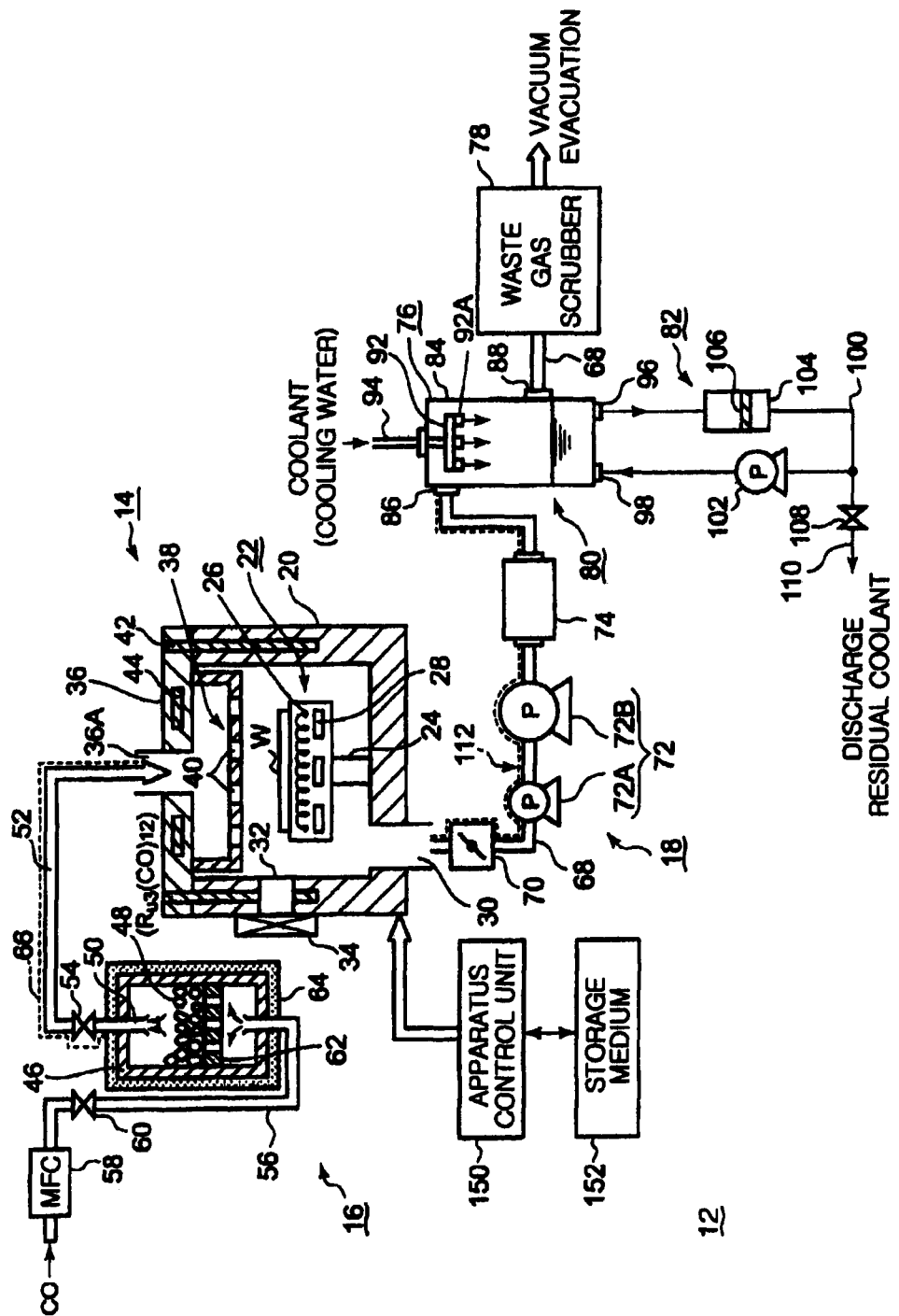
FIG. 1 is a schematic configuration view showing a first embodiment of a film forming apparatus having a mounting table structure in accordance with the present invention.
Figure 2:
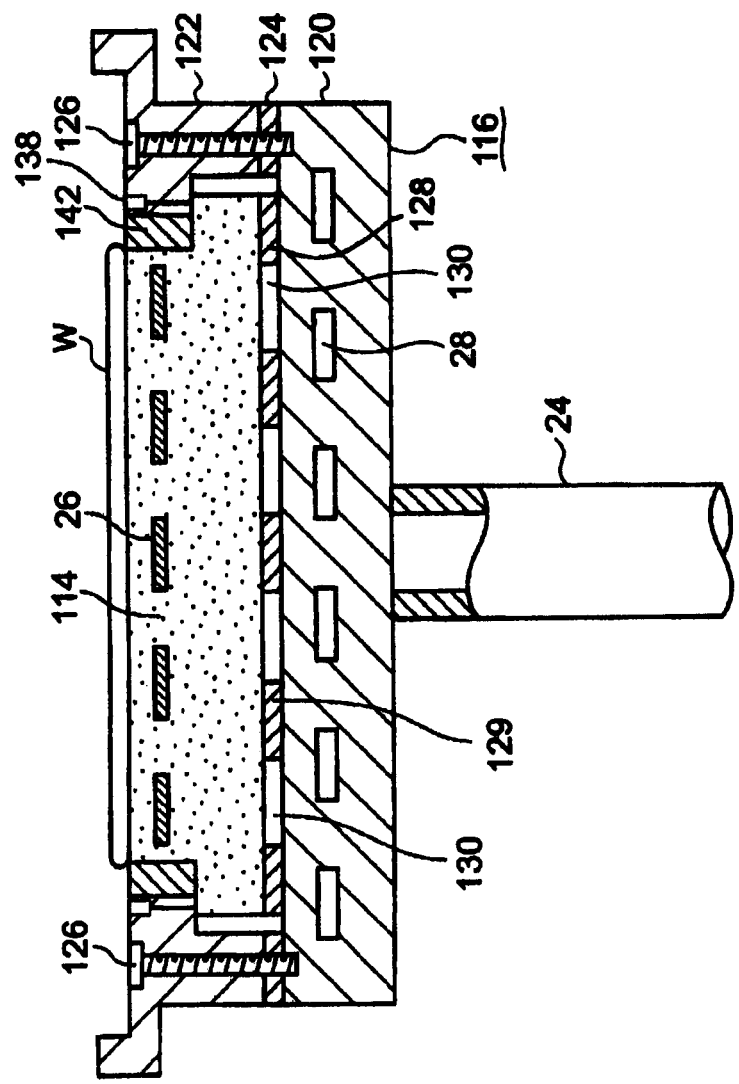
FIG. 2 is an enlarged cross sectional view showing a first embodiment of the mounting table structure.
Figure 3:
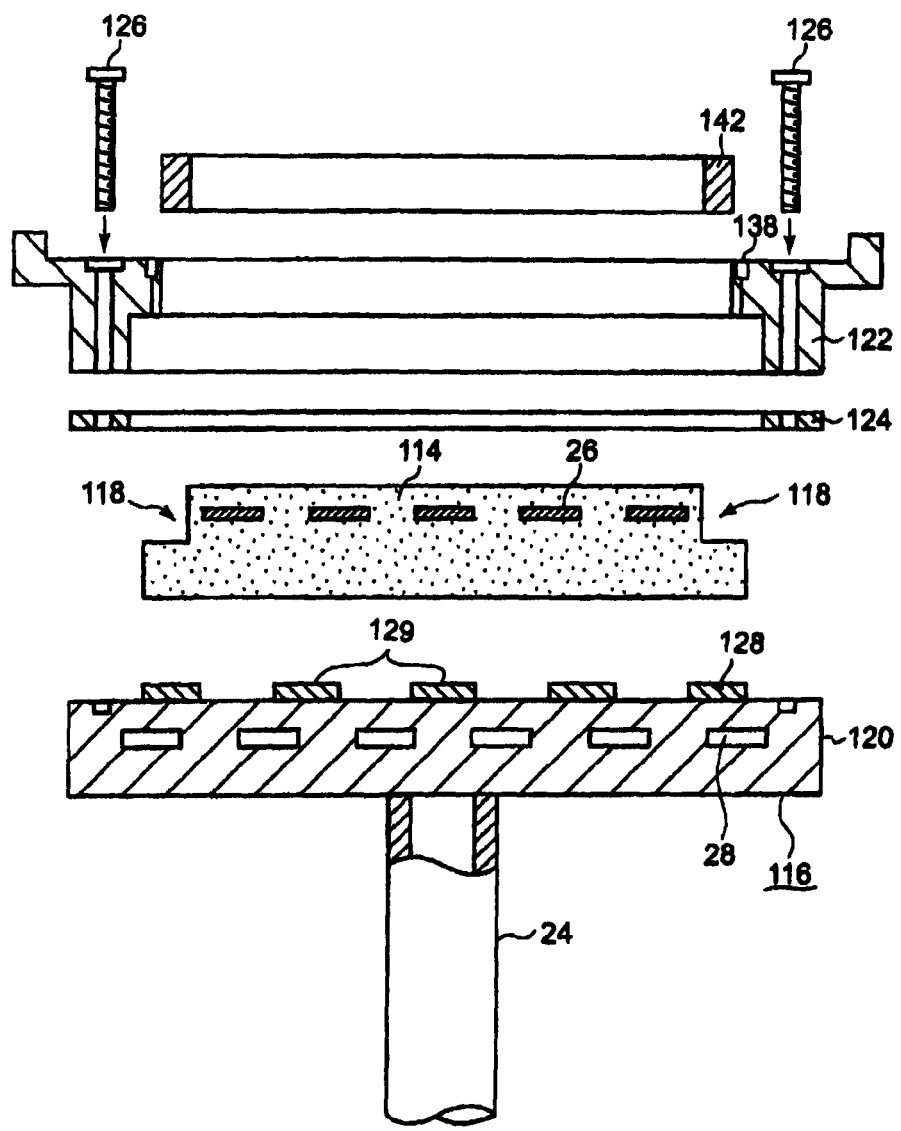
FIG. 3 is an exploded cross sectional view showing details of the mounting table structure.
Figure 4:
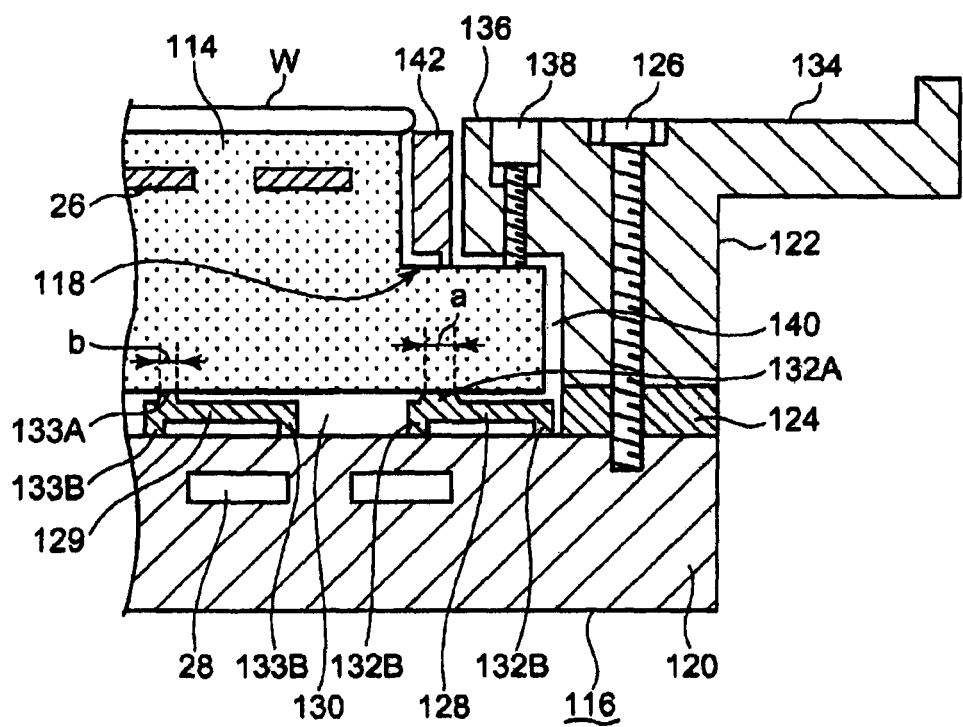
FIG. 4 is a partially enlarged cross sectional view showing a part of the first embodiment of the mounting table structure.
Figure 5:
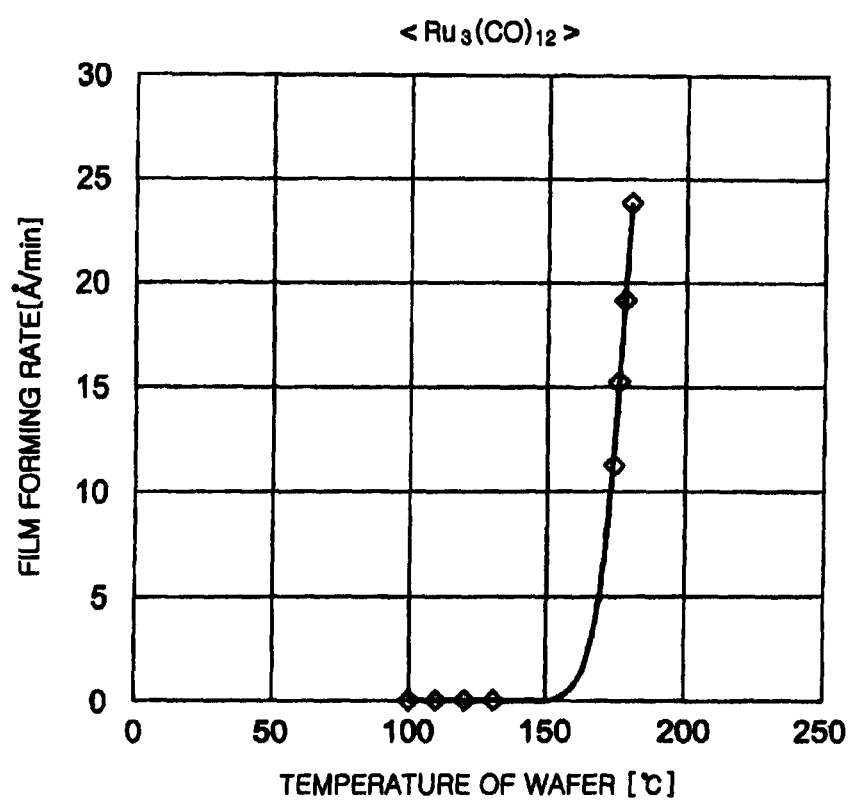
FIG. 5 is a graph showing relationship between temperature of a semiconductor wafer and a film forming rate.

FIG. 1 is a schematic configuration view showing a first embodiment of a film forming apparatus having a mounting table structure in accordance with the present invention. FIG. 2 is an enlarged cross sectional view showing a first embodiment of the mounting table structure. FIG. 3 is an exploded cross sectional view showing details of the mounting table structure. FIG. 4 is an enlarged cross sectional view showing a part of the first embodiment of the mounting table structure. FIG. 5 is a graph showing relationship between temperature of a semiconductor wafer and a film forming rate. Here, the case of forming a thin film, e.g., a Ru metal film, by using an organic metal compound, e.g., $Ru_3(CO)_{12}$ that is a carbonyl-based organic metal compound, and a carrier gas, e.g., CO (carbon monoxide), will be described as an example.

As shown in FIG. 1, a film forming apparatus 12 of the present embodiment mainly includes a film forming apparatus main body 14 for performing a film forming process on a circular plate-shaped semiconductor wafer W as a target object to be processed, a raw material gas supply system 16 for supplying a raw material gas for film formation to the film forming apparatus main body 14, and a gas exhaust system 18 for discharging an exhaust gas from the film forming apparatus main body 14.

First of all, the film forming apparatus main body 14 will be described. The film forming apparatus main body 14 includes a cylindrical processing chamber 20 made of, e.g., aluminum alloy or the like. A mounting table structure 22 of the present embodiment which mounts and supports thereon the semiconductor wafer W as the target object is provided in the processing chamber 20. The mounting table structure 22 is entirely formed in, e.g., a circular plate shape, and the semiconductor wafer W is mounted on the top surface thereof. The mounting table structure 22 is fixed to an upper portion of a support 24 made of a metal, e.g., aluminum alloy or the like, the support 24 standing upright on the bottom portion of the processing chamber 20.

A heater 26 such as a tungsten wire heater, a carbon wire heater or the like which serves as a heating unit is buried in the upper portion of the mounting table structure 22 to heat the semiconductor wafer W. Provided below the heater 26 is a coolant path 28 where a coolant flows for a temperature control by cooling a bottom portion or side portions of the mounting table structure 22. Further detailed description of the mounting table structure 22 will be provided later. Moreover, the mounting table structure is provided with lifter pins (not shown) that are vertically moved up and down to transfer the semiconductor wafer W to and from a transfer arm when the semiconductor wafer W is loaded and unloaded.

A gas exhaust port 30 is provided at the bottom portion of the processing chamber 20. The gas exhaust system 18 is connected to the gas exhaust port 30, so that the atmosphere in the processing chamber 20 can be evacuated to vacuum. The gas exhaust system 18 will be described later. An opening 32 through which the semiconductor wafer W is loaded or unloaded is formed on a sidewall of the processing chamber 20, and a gate valve 34 for airtightly opening and closing the opening 32 is provided at the opening 32.

A gas introduction unit 38 including a shower head 36 is provided at a ceiling portion of the processing chamber 20, and a desired gas is supplied into the processing chamber 20 through gas injection openings 40 formed at the bottom surface thereof. Further, heaters 42 and 44 are provided at the sidewall of the processing chamber 20 and the shower head 36, respectively. By maintaining the heaters 42 and 44 at predetermined temperatures, the solidification or the liquefaction of the raw material gas is prevented. A gas inlet 36A of the shower head 36 is connected to a raw material gas supply system 16 or another gas supply system, if another gas is required. Depending on types of gases, the raw material gas and another gas may be mixed in the shower head 36, or may be separately introduced through the shower head 36 and then mixed in the processing chamber 20. Although the shower head 36 is used in the gas introduction unit 38 in this example, a simple nozzle may be used instead. The type of gas introduction is not limited particularly.

Hereinafter, the raw material gas supply system 16 will be described. The raw material gas supply system 16 has a raw material tank 46 for storing a solid raw material or a liquid raw material. Here, a raw material of an organic metal compound, e.g., a solid raw material 48, is stored in the raw material tank 46. As for the solid raw material 48, $Ru_3(CO)_{12}$ is used, as described above. Generally, the solid raw material 48 has a low vapor pressure and thus is hardly vaporized. Instead of the solid raw material 48, a liquid raw material for forming a raw material gas by bubbling or the like may also be used.

A raw material path 52 has one end connected to a gas outlet 50 disposed at a ceiling portion of the raw material tank 46 and the other end connected to the gas inlet 36A of the shower head 36 of the film forming apparatus main body 14. Accordingly, the raw material gas produced in the raw material tank 46 can be properly supplied. Furthermore, an opening/closing valve 54 is installed at a portion of the raw material path 52, the portion being located close to the raw material tank 46.

A carrier gas line 56 for supplying a carrier gas into the raw material tank 46 is connected to the bottom surface of the raw material tank 46. A flow rate controller 58 such as a mass flow controller and a carrier gas opening/closing valve 60 are sequentially installed in the carrier gas line 56. The raw material gas can be formed by heating and vaporizing the solid raw material 48 while supplying the carrier gas at a controlled flow rate.

A porous plate 62 is provided at a place close to the carrier gas line 56 in the raw material tank 46. The solid raw material 48 is held above the porous plate 62. The carrier gas flowing through the carrier gas line 56 is uniformly supplied into the raw material tank 46 through openings formed in the porous plate 62. Here, CO (carbon monooxide) is used as the carrier gas.

A tank heating unit 64 for heating the raw material tank 46 covers the entire tank and, hence, the vaporization of the solid raw material 48 is facilitated. In this case, the heating temperature of the solid raw material 48 is set to a temperature higher than the solidification temperature of the raw material gas, but lower than the decomposition temperature of the raw material gas. Further, a path heater 66 such as a tape heater is provided along the raw material path 52 to thereby heat the raw material path 52 to a temperature higher than the solidification temperature of the raw material gas, but lower than the decomposition temperature of the raw material gas. Therefore, the resolidification of the raw material gas can be prevented.

Hereinafter, the gas exhaust system 18 will be described. The gas exhaust system 18 has a gas exhaust path 68 connected to the gas exhaust port 30 of the processing chamber 20, and the atmosphere in the processing chamber 20 is exhausted through the gas exhaust path 68. Specifically, a pressure control valve 70, a vacuum pump unit 72, an auxiliary trap mechanism 74 and a main trap mechanism 76 forming a trap mechanism, and a waste gas scrubber 78 are sequentially installed in the gas exhaust path 68 from the upstream side toward the downstream side thereof.

The pressure control valve 70 is configured as, e.g., a butterfly valve, and has a function of controlling a pressure in the processing chamber 20. A vacuum pump unit 72 has a turbo molecular pump 72A disposed at the upstream side and a dry pump 72B disposed at the downstream side.

The vacuum pump unit can evacuate the atmosphere in the processing chamber 20 to vacuum. In this case, only one of the two pumps 72A and 72B may be provided depending on the processing pressure set for the film formation.

The auxiliary trap mechanism 74 has a function of recovering an unreacted raw material gas contained in the exhaust gas by cooling the exhaust gas flowing therethrough. Specifically, in this embodiment, the auxiliary trap mechanism 74 is provided at the front end of the main trap mechanism 76 to recover a part of the unreacted raw material gas. The auxiliary trap mechanism 74 can be effectively used especially when the amount of the unreacted raw material gas is large or when the recovery performance of the main trap mechanism 76 disposed at the rear end of the auxiliary trap mechanism 74 is not sufficient. In other words, the auxiliary trap mechanism 74 may not be provided when the amount of the unreacted raw material gas is small or the recovery performance of the main trap mechanism 76 is sufficient. As for the auxiliary trap mechanism 74, it is possible to use, e.g., a cryopump having a cryopanel cooled to an extremely low temperature. The unreacted raw material gas is cooled and adsorbed by the cryopanel.

The main trap mechanism 76 as well as the auxiliary trap mechanism 74 has a function of recovering the unreacted raw material gas contained in the exhaust gas by cooling the exhaust gas. Specifically, in this embodiment, the main trap mechanism 76 is provided to recover most of the unreacted raw material gas, i.e., $Ru_3(CO)_{12}$ gas. The main trap mechanism 76 mainly includes a solidification unit 80 in which the unreacted raw material gas is solidified to the raw material by cooling the exhaust gas by making it contact with the coolant, and a filtration recovery unit 82 for separating and recovering the resolidified raw material from the coolant by filtering the coolant in the solidification unit 80.

The solidification unit 80 has a cylindrical solidification container 84 configured as, e.g., a scrubber device. A gas inlet 86 is formed at an upper portion of a sidewall of the solidification container 84, and is connected to one side of the gas exhaust path 68. A gas outlet 88 is provided at a central portion or a portion slightly lower than the central portion of a sidewall opposite to the sidewall at which the gas inlet 86 is formed, and is connected to the other side of the gas exhaust path 68.

Accordingly, the exhaust gas is introduced into the solidification container 84 through the gas inlet 86, and then is discharged therefrom through the gas outlet 88. A baffle plate or the like may be provided in the solidification container 84 to increase a length of a path where the exhaust gas flows in the solidification container 84. Further, a shower head 92 having a plurality of nozzles 92A is provided at a ceiling portion of the solidification container 84. A liquid supply line 94 is connected to the shower head 92, and the coolant can flow therethrough. Hence, in the solidification container 84, the coolant is injected in a shower shape from the nozzles 92A, and the exhaust gas is cooled by making it contact with the coolant.

As for the coolant, a coolant that is not soluble or hardly soluble in the raw material is used. Here, cooling water is used, for example. The unreacted raw material gas in the exhaust gas is solidified to the $Ru_3(CO)_{12}$ serving as the raw material by the cooling of the coolant. The cooling water is used as the coolant because $Ru_3(CO)_{12}$ is stable in the cooling water (water) without being decomposed.

A liquid outlet 96 and a liquid inlet 98 are provided at the bottom portion of the solidification container 84. Moreover, the filtration recovery unit 82 is provided in a circulation path 100 which connects the liquid outlet 96 and the liquid inlet 98. A circulation pump 102 is installed in the circulation path 100 to circulate the coolant containing the resolidified raw material in the solidification container 84 through the circulation path 100.

A recovery container 104 for recovering the resolidified raw material from the coolant is provided at the upstream side of the circulation pump 102 in the circulation path 100. A filter 106 is exchangeably provided in the recovery container 104. By filtering the coolant through the filter 106, the resolidified raw material can be recovered.

A discharge line 110 having a discharge opening/closing valve 108 is branched from the circulation path 100 between the circulation pump 102 and the recovery container 104. Accordingly, a residual coolant can be discharged to the outside of the system, if necessary. A path heater 112 such as a tape heater or the like is provided along the gas exhaust path 68 extending from the gas exhaust port 30 of the processing chamber 20 to the main trap mechanism 76 and the members (including the vacuum pump unit 72) disposed therein. Hence, the exhaust gas flowing in the gas exhaust path 68 is heated to a predetermined temperature, so that the unreacted raw material gas in the exhaust gas is prevented from being liquefied or solidified.

If the gas exhaust path 68 extending from the gas exhaust port 30 of the processing chamber 20 to the main trap mechanism 76 is excessively long, e.g., if the installation cost of the path heater 112 is high, it is possible to provide the auxiliary trap mechanism 74 and the main trap mechanism 76 between the pressure control valve 70 and the turbo molecular pump 72A or between the turbo molecular pump 72A and the dry pump 72B. In this case, a part of the path heater 112 which may be disposed at the downstream side from the main trap mechanism 76 can be omitted, and the installation area of the path heater 112 can also be decreased.

The waste gas scrubber 78 provided at the downstream side of the main trap mechanism 76 detoxifies harmful gases in the exhaust gas. Here, CO (carbon monoxide) is generated by the decomposition of the raw material, and CO is also used as a carrier gas. The waste gas scrubber 78 detoxifies CO into $CO_2$ (carbon dioxide) by, e.g., combustion, and diffuses $CO_2$ into the atmosphere.

First Embodiment of the Mounting Table Structure

Hereinafter, a first embodiment of the mounting table structure 22 of the present invention provided in the processing chamber 20 will be described in detail. As described above, the mounting table structure 22 includes the heater 26 and the coolant path 28. Specifically, as shown in FIGS. 2 to 4, the mounting table structure 22 includes: a mounting table main body 114 having a semiconductor wafer W mounted thereon and the heater 26 buried therein; and a base 116, which supports the mounting table main body 114 while surrounding the side surface and the bottom surface of the mounting table main body 114 and has therein a coolant path 28 where a coolant flows therethrough, so that the base is maintained at a temperature higher than the solidification temperature or the liquefaction temperature of the raw material gas, but lower than the decomposition temperature of the raw material gas.

The mounting table main body 114 is entirely formed in a circular plate shape and made of ceramic, metal or the like. The heater 26, such as a tungsten wire heater, a carbon wire heater or the like, which serves as a heating unit is buried in the substantially entire region of the mounting table main body 114 while being insulated, so that the semiconductor wafer W mounted directly on the top surface of the mounting table main body 114 can be heated and controlled to be maintained at a desired temperature.

The ceramic may be, e.g., aluminum nitride (AlN), aluminum oxide ($Al_2O_3$), silicon carbide (SiC) or the like. The metal may be aluminum, aluminum alloy or the like. A diameter of the mounting table main body 114 is set to be slightly smaller than that of the semiconductor wafer W. For example, when the diameter of the semiconductor wafer W is about 300 mm, the diameter of the mounting table main body 114 is set to about 295 mm. A stepped portion 118 having a right-angled cross sectional shape (see FIG. 3) is formed in a ring shape at the circumferential edge of the mounting table main body 114 along the circumferential direction thereof.

The base 116 is entirely made of a metal. The base 116 mainly includes a circular plate-shaped base portion 120 which is made of a metal and has the coolant path 28 buried in the substantially entire region thereof, and a ring-shaped edge ring 122 which is made of a metal and provided on the circumferential portion of the base portion 120 so as to surround the side surface of the mounting table main body 114. The coolant such as cooling water, Fluorinert, Galden (Registered Trademark) or the like flows into the coolant path 28 through a line (not shown).

A ring-shaped thermal conduction buffer member 124 made of a metal having a thermal conductivity lower than that of a metal forming the edge ring 122 and the base portion 120 is provided between the base portion 120 and the edge ring 122 in order to reduce the cooling of the edge ring 122. Further, the edge ring 122, the thermal conduction buffer member 124 and the base portion 120 are detachably (separably) coupled as one unit by a plurality of bolts 126 inserted from above. Thus, the edge ring 122 and the thermal conduction buffer member 124 are detachable components in the processing chamber 20.

In this embodiment, the base portion 120 or the edge ring 122 are made of aluminum or aluminum alloy, and the thermal conduction buffer member 124 is made of stainless steel having a thermal conductivity lower than that of aluminum or aluminum alloy. The thermal conduction buffer member 124 can be omitted, if not necessary. Further, instead of aluminum or aluminum alloy, stainless steel having a lower thermal conductivity may be used for the base portion 120 or the edge ring 122.

Besides, thermal insulators 128 and 129 are provided between the top surface of the base portion 120 and the bottom portion (bottom surface) of the mounting table main body 114. In a state where the mounting table main body 114 is supported by the thermal insulators 128 and 129, the thermal insulation between the base portion 120 and the mounting table main body 114 can be obtained. As for the thermal insulators 128 and 129, it is possible to use ceramic or stainless steel having a low thermal conductivity and high heat resistance.

Specifically, the thermal insulator 128 is in a ring-shape and provided to support the outer peripheral portion of the bottom portion of the mounting table main body 114, and the thermal insulators 129 formed of a plurality of small segments and provided to support the inner peripheral portion of the bottom portion of the mounting table main body 114. Since a plurality of spaces 130 exists between the small segment-shaped thermal insulators 129, the insulation property is improved (see FIG. 4). As shown in FIG. 4, the thermal insulators 128 and 129 have support protrusions 132A and 133A at upper portions thereof and leg portions 132B and 133B at lower portions thereof. Therefore, the contact area (heat transfer area) is minimized, and the thermal insulation property is further improved. The support protrusions 132A and 133A have flat portions at leading ends thereof. A diametrical length of a flat portion 'a' of the ring-shaped thermal insulator 128 is greater than that of a flat portion 'b' of the small segment-shaped thermal insulator 129, and the intrusion of the atmosphere in the processing space into spaces 130 is effectively inhibited.

As shown in FIG. 4, a ring-shaped flange portion 134 is formed such that the top surface of the edge ring 122 extends outward in the radial direction of the semiconductor wafer W by a predetermined distance while maintaining substantially the same horizontal level as that of the mounting surface of the semiconductor wafer W. Accordingly, the raw material gas flowing from above toward the peripheral portion of the semiconductor wafer W is guided toward the semiconductor wafer W, and the film formation is effectively carried out.

A ring-shaped protrusion 136 protrudes toward the inner peripheral side of the edge ring 122 (toward the semiconductor wafer W) at the upper portion thereof along the circumferential direction of the edge ring 122. The protrusion 136 extends toward the intermediate portion of the stepped portion 118 of the mounting table main body 114. Further, a clamp screw 138 is formed in the protrusion 136 so as to penetrate therethrough from top to bottom. By moving the clamp screw 138 downward, the peripheral portion of the mounting table main body 114 is pressed, and the mounting table main body 114 is fixed. The inner peripheral surface of the edge ring 122 and the outer peripheral surface of the mounting table main body 114 do not directly contact with each other, and a thermal insulating space 140 exists therebetween. By providing, e.g., only six clamp screws 138 the thermal insulation property between the edge ring 122 and the mounting table main body 114 is increased.

A ring-shaped shield ring 142 is loosely and detachably provided between the upper side surface of the stepped portion 118 of the mounting table main body 114 and the inner peripheral surface of the protrusion 136 of the edge ring 122. Therefore, the shield ring 142 is detachable component provided in the processing chamber 20. The shield ring 142 is made of a metal such as aluminum, aluminum alloy or the like, and has functions of preventing film formation on the sidewall of the mounting table main body 114, ensuring in-plane temperature uniformity of the semiconductor wafer W, preventing film formation on the backside of the semiconductor wafer W, ensuring thermal insulation between the mounting table main body 114 and the edge ring 122, and the like.

The entire operation of the film forming apparatus 12 configured as described above, e.g., control of start and stop of gas supply, control of a processing temperature, a processing pressure, and a temperature of a coolant flowing in the coolant path 28, control of supply and circulation of a coolant in the main trap mechanism 76, and the like, are performed by an apparatus control unit 150 including, e.g., a computer (see FIG. 1).

A computer-readable program required for such control is stored in a storage medium 152. The storage medium 152 may be a flexible disc, a CD (Compact Disc), a CD-ROM, a hard disc, a flash memory, a DVD or the like.

First Embodiment of a Raw Material Recovery Method

Figure 6:
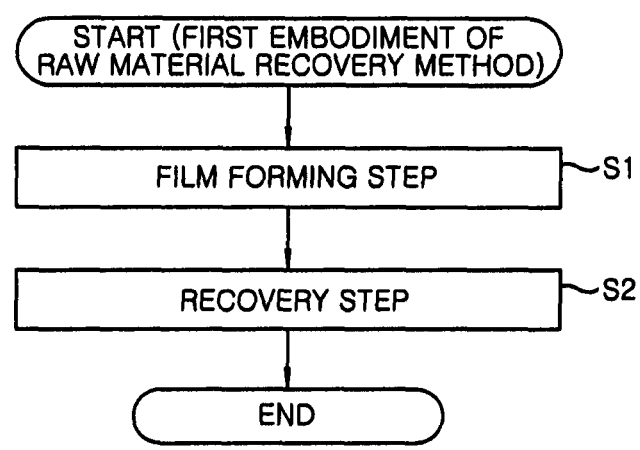
FIG. 6 is a flowchart showing a first embodiment of a raw material recovery method in accordance with the present invention.

Hereinafter, a first embodiment of a raw material recovery method performed by employing the first embodiment of the film forming apparatus 12 configured as described above will be described with reference to FIG. 6. FIG. 6 is a flowchart showing the first embodiment of the raw material recovery method in accordance with the present invention. First of all, as shown in FIG. 1, in the film forming apparatus main body 14 of the film forming apparatus 12, the turbo molecular pump 72A and the dry pump 72B of the vacuum pump unit 72 of the gas exhaust system 18 are constantly driven, so that the interior of the processing chamber 20 is evacuated to vacuum and maintained at a predetermined pressure. The semiconductor wafer W supported by the mounting table structure 22 is maintained at a predetermined temperature by the heater 26. The sidewall of the processing chamber 20 and the shower head 36 are also maintained at another predetermined temperature by the heaters 42 and 44, respectively. The latter predetermined temperature is higher than the solidification temperature or the liquefaction temperature of the raw material gas, but lower than the decomposition temperature of the raw material gas, which is, e.g., about 80° C.

The entire raw material gas supply system 16 is heated in advance to a predetermined temperature, e.g., about 80° C. as described above, by the tank heating unit 64 and/or the path heater 66. In the raw material gas supply system 16, when the film forming process is started, the carrier gas (CO) is supplied at a controlled flow rate into the raw material tank 46 through the carrier gas line 56, and the solid raw material 48 stored in the raw material tank 46 is vaporized by heating. As a result, a raw material gas is produced.

The raw material gas thus produced flows through the raw material path 52 toward the downstream side together with the carrier gas. The raw material gas is introduced into the processing chamber 20 set in the depressurized atmosphere through the shower head 36 of the film forming apparatus main body 14. Accordingly, a Ru metal thin film is formed on the semiconductor wafer W in the processing chamber 20 by, e.g., CVD (Chemical Vapor Deposition). In this manner, a film forming step S1 shown in FIG. 6 is carried out. At this time, the processing conditions are set as follows: a processing pressure is set to about 0.1 Torr (13.3 Pa); and a temperature of a semiconductor wafer is set to a temperature equal to or higher than the decomposition temperature of the raw material gas, which is in a range from, e.g., about 150 to 250° C. As shown in FIG. 5, when the temperature exceeds about 150° C., the film forming rate is abruptly increased. Therefore, the sufficient film forming rate can be obtained at such temperature. During the film forming step, a thin film is deposited on the top surface of the semiconductor wafer W, whereas an unnecessary thin film is hardly deposited on the mounting table structure 22 due to the temperature control to be described later.

Here, $Ru_3(CO)_{12}$ serving as the solid raw material 48 has a considerably low vapor pressure and thus is hardly vaporized (sublimated). An extremely small amount (ratio) of $Ru_3(CO)_{12}$ contributes to the film forming reaction, and about 90% of the raw material gas in an unreacted state flows through the gas exhaust path 68 of the gas exhaust system 18 together with the carrier gas of CO. The gas exhaust path 68 is also heated to about 80° C. by the path heater 112, so that the resolidification of the raw material gas is prevented. The film forming reaction is expressed by the following chemical formulas, and results in production of CO (carbon monoxide) that is the same gas type as the carrier gas.

$$Ru_3(CO)_{12} \square Ru_3(CO)_{12}\uparrow$$

$$Ru_3(CO)_{12}\uparrow \square Ru_3(CO)_{12-x}\uparrow + XCO\uparrow$$

$$Ru_3(CO)_{12-x}\uparrow + Q \rightarrow 3Ru + (12-X)CO\uparrow$$

$$Ru_3(CO)_{12}\uparrow + Q \rightarrow 3Ru + 12CO\uparrow$$

Here, "☐" indicates reversible reaction; the raw material with "↑" indicates that it is in a gaseous state; the raw material without "↑" indicates that it is in a solid state; and "Q" indicates heat application.

The exhaust gas flowing in the gas exhaust path 68 flows sequentially through the pressure control valve 70, the turbo molecular pump 72A, the dry pump 72B, the auxiliary trap mechanism 74, the main trap mechanism 76 and the waste gas scrubber 78, and then is diffused to the atmosphere. In this case, CO gas remains as the exhaust gas after the unreacted raw material gas is recovered. The CO gas is scrubbed by combustion in the waste gas scrubber 78, and then is diffused as $CO_2$ gas to the atmosphere.

The exhaust gas is cooled by the cryopanel while passing through the auxiliary trap mechanism 74 configured as, e.g., a cryopump. Accordingly, a part of the unreacted raw material gas is condensed (solidified), and the resolidified raw material is recovered by adhesion to the cryopanel.

Continuously, the discharged exhaust gas from the auxiliary trap mechanism 74 is introduced into the main trap mechanism 76 and comes into contact with the coolant. As a consequence, most of the unreacted raw material gas is recovered. In this manner, a recovery step S2 shown in FIG. 6 is carried out. This raw material recovery method is performed as follows. The unreacted raw material gas is solidified to the raw material by cooling the exhaust gas by making it contact with the coolant, and the resolidified raw material is recovered by separating it from the coolant.

Specifically, as shown in FIG. 1, in the solidification unit 80, the exhaust gas introduced into the solidification container 84 through the gas inlet 86 is cooled by making it contact with the coolant injected from the nozzles 92A of the showerhead 92 disposed at the ceiling portion, and then is discharged from the gas outlet 88. When the exhaust gas is cooled by making it contact with the coolant, i.e., cooling water in this example, the unreacted raw material gas contained in the exhaust gas is also cooled and condensed (or solidified) to the raw material. In this case, the temperature of the cooling water depends on the vaporization temperature (sublimation temperature) of the raw material. Preferably, it is in a range from, e.g., about 0 to 30° C.

The resolidified raw material remains in the bottom portion of the solidification container 84 together with the coolant (cooling water). Further, CO serving as a carrier gas is hardly soluble in the cooling water. By driving the circulation pump 102 of the filtration recovery unit 82, the coolant in the solidification container 84 is discharged through the liquid outlet 96 to the circulation path 100. Then, the coolant flows through the circulation path 100 and returns to the solidification container 84 through the liquid inlet 98. In other words, the coolant is circulated. In this case, the coolant flowing in the circulation path 100 passes through the recovery container 104.

When the coolant flows in the recovery container 104, the resolidified raw material contained in the coolant is filtered by the filter 106 and remains in the filter 106 so that it can be recovered later. In this case, $Ru_3(CO)_{12}$ serving as the raw material is hardly soluble in cooling water serving as the coolant, so that most of the resolidified raw material mixed in the coolant can be filtered by the filter 106 and recovered.

In this case, a plurality of recovery containers 104 may be provided in parallel and used alternately. The recovered raw material is present without being mixed with impurities and thus need not be purified. In other words, the recovered raw material can be used, after being dried, as the solid raw material 48 in the raw material tank 46. From the actual analysis on the recovered raw material, it has been found out that none of Ru as a metal, $Ru_3(CO)_{12-x}$ as an intermediate product or the like was detected. Only $Ru_3(CO)_{12}$ was detected.

Hereinafter, the film formation state on the semiconductor wafer W mounted on the mounting table structure 22 in the processing chamber 20 will be described in detail. As described above, the semiconductor wafer W is heated to a high temperature in a range from about 150 to 250° C., e.g., about 190 to 230° C., during the film formation. This indicates that the mounting table main body 114 on which the semiconductor wafer W directly is mounted is heated to the corresponding high temperature by the heater 26 buried therein. On the other hand, since the cooling water, for example, is circulated in the coolant path 28, the base 116 which supports the mounting table main body 114 is maintained at a low temperature higher than the solidification temperature or the liquefaction temperature of the raw material gas, but lower than the decomposition temperature of the raw material gas, which is in a range from, e.g., about 80 to 110° C.

The decomposition temperature of the raw material gas is about 150° C., and the solidification temperature of the raw material gas is about 75° C. In the present embodiment, specifically, the base portion 120 of the base 116 is maintained at about 80° C., and the edge ring 122 which surrounds the side surface of the mounting table main body 114 is maintained at about 100° C. The temperatures of these components including the thermal conduction buffer member 124 interposed therebetween are set to be lower than the thermal decomposition temperature of the raw material gas. Therefore, it is possible to effectively prevent an unnecessary Ru thin film from being deposited on the surfaces of these components.

The mounting table main body 114 and the base portion 120 are insulated from each other by the thermal insulators 128 and 129 or the spaces 130. Further, the mounting table main body 114 and the edge ring 122 are insulated from each other by the space 140. Therefore, even if the temperature of the mounting table main body 114 is increased to a temperature in a range between, e.g., about 190 and 230° C., the base portion 120 which supports the mounting table main body 114, the edge ring 122 or the thermal conduction buffer member 124 can be effectively cooled. As a result, the deposition of an unnecessary thin film on these components can be effectively prevented, as described above.

However, if the edge ring 122 is cooled to about 80° C., a large temperature difference is generated between the edge ring 122 and the semiconductor wafer W. This may cause adverse effects on the film formation on the peripheral portion of the semiconductor wafer W. Hence, it is preferable to set the temperature of the edge ring 122 to be higher than that of the base portion 120 by providing the thermal insulation buffer member 124 between the edge ring 122 and the base portion 120, as described above. The inner side of the ring-shaped shield ring 142 disposed between the edge ring 122 and the mounting table main body 114 is positioned close to the mounting table main body 114 heated to a high temperature, and thus has a temperature equal to or higher than the thermal decomposition temperature of the raw material gas. This results in the deposition of an unnecessary thin film on the top surface of the shield ring 142. However, the amount of the thin film deposited thereon is small.

As described above, a thin film is deposited only on a desired portion, i.e., the surface of the semiconductor wafer W, and unnecessary thin films are not deposited on the surface of the base 116 including the surface of the edge ring 122, the surface of the base portion 120, the surface of the thermal conduction buffer member 124 or the like. Therefore, the raw material on the surface of the base 116 is not consumed and flows toward the gas exhaust system 18 in an unreacted state, and then is recovered as a raw material through the above-described recovery step S2. When no unnecessary thin film is deposited, it is possible to reduce the frequency of the dry cleaning or omit the dry cleaning, as described above.

In accordance with the present embodiment, the mounting table structure for use in forming a thin film, e.g., a Ru metal film, on a semiconductor wafer W as a target object to be processed by using a raw material gas containing an organic metal compound, e.g., $Ru_3(CO)_{12}$ gas, in the processing chamber 20 includes: the mounting table main body 114 which mounts the target object thereon and has the heater 26 buried therein; and the base 116 which supports the mounting table main body 114 while surrounding the side surface and the bottom surface of the mounting table main body 114, the base 116 having therein the coolant path 28 where a coolant flows therethrough and being maintained at a temperature higher than the solidification temperature or the liquefaction temperature of the raw material gas, but lower than the decomposition temperature of the raw material gas.

Accordingly, the deposition of an unnecessary thin film on the base 116 is suppressed, and the deposition of a thin film on a desired portion, i.e., the surface of the target object is facilitated. As a result, it is possible to reduce the frequency of the dry cleaning process or omit the dry cleaning process. Further, the raw material or the metal contained in the raw material can be effectively recovered at a low cost.

Second Embodiment of a Raw Material Recovery Method

Figure 7:
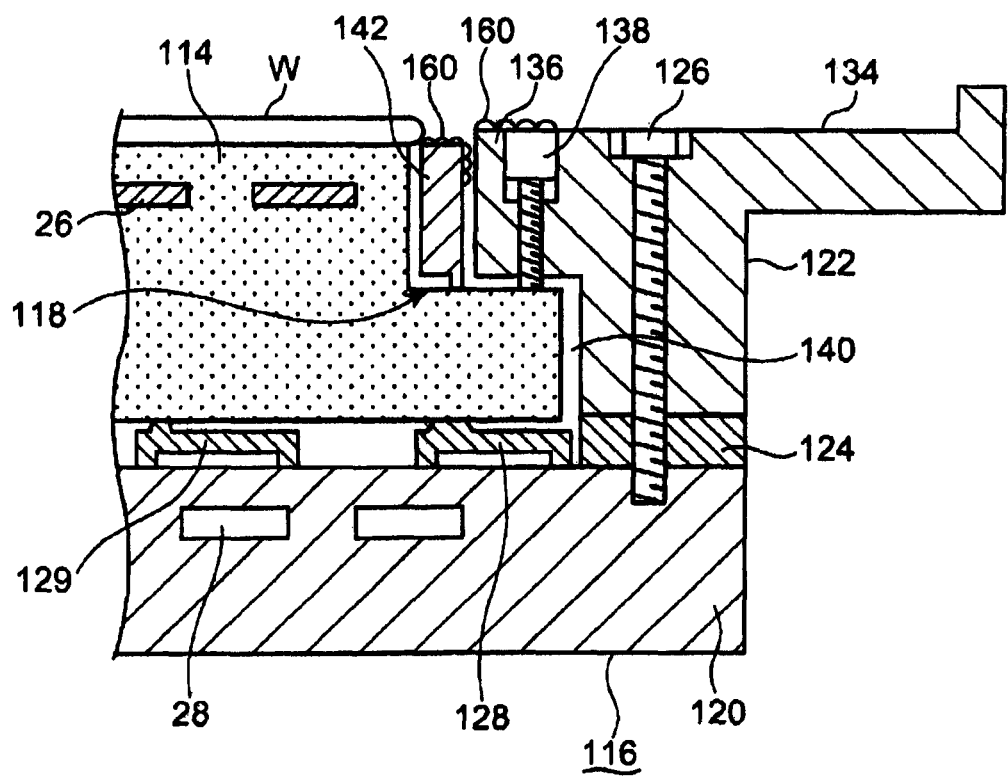
FIG. 7 is a partially enlarged cross sectional view showing a mounting table structure.

In the first embodiment of the raw material recovery method, the temperature of the base 116 is set to a level higher than the solidification temperature or the liquefaction temperature of the raw material gas, but lower than the decomposition temperature of the raw material gas to suppress the deposition of an unnecessary thin film on the surface of the base 116. However, in reality, as can be seen from the partially enlarged cross sectional view of the mounting table structure shown in FIG. 7, an unnecessary thin film 160 such as a Ru thin film may be adhered on the top surface of the shield ring 142 or the inner peripheral portion of the top surface of the edge ring 122 of the mounting table structure 22.

Further, in order to further increase the in-plane temperature uniformity of the semiconductor wafer W, the temperature of the edge ring 122 may be intentionally increased to a medium temperature in a range from about 150 to 180° C. In that case, the tendency of adhesion of the unnecessary thin film 160 on the inner peripheral portion of the top surface of the edge ring 122 is increased.

Figure 8A:
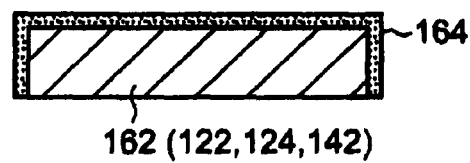
FIGS. 8A to 8C are schematic views showing changes in a component having a coating film in case of performing a second embodiment of a raw material recovery method in accordance with the present invention.
Figure 8B:
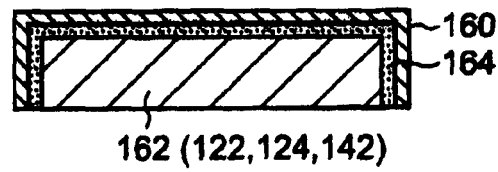
Figure 8C:
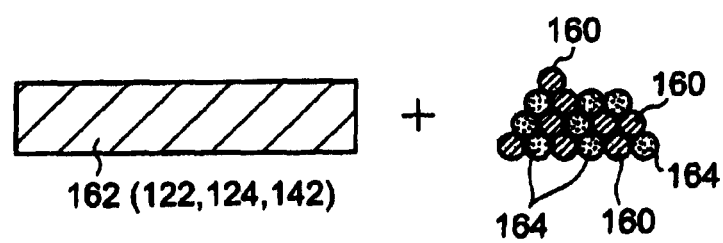
Figure 9:
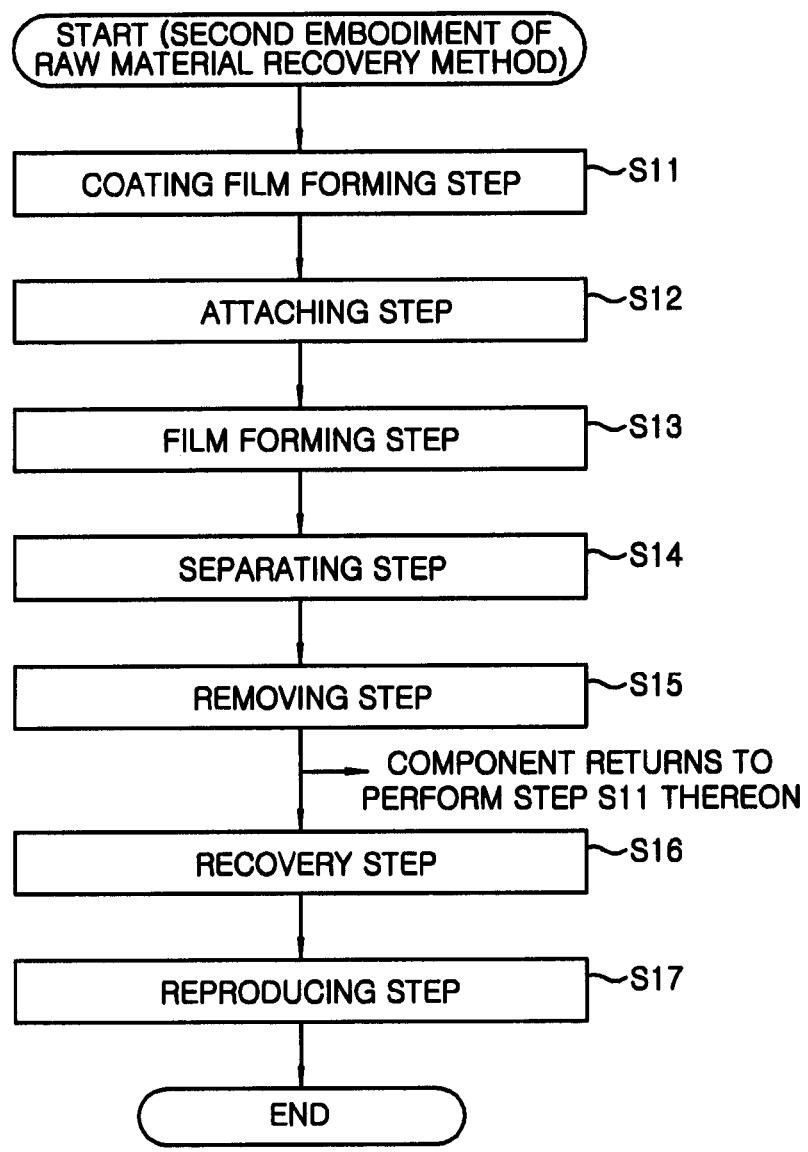
FIG. 9 is a flowchart showing the second embodiment of the raw material recovery method in accordance with the present invention.

In this case, upon completion of the film formation on a certain number of semiconductor wafers W, a high-cost metal is recovered from the unnecessary thin film 160 by separating the components from the mounting table structure. However, the unnecessary thin film 160 is strongly adhered to the components and is not easily peeled off. In order to make the metal recovery process easier, the second embodiment of the raw material recovery method includes: forming in advance a coating film to be removed later on a component; and adhering an unnecessary thin film to the coating film. FIGS. 8A to 8C are schematic views showing changes in the component having the coating film in the case of performing the second embodiment of the raw material recovery method in accordance with the present invention. FIG. 9 is a flowchart showing the second embodiment of the raw material recovery method in accordance with the present invention.

Before the film forming process is carried out, a detachable component 162 of the mounting table structure 22, i.e., an exchangeable component, is separated. Then, a coating film 164 is formed on a surface of the component 162, as shown in FIG. 8A. In this manner, a coating film forming step is carried out (step S11 in FIG. 9).

Here, the detachable component 162 includes the edge ring 122, the thermal conduction buffer member 124 and the shield ring 142 of the mounting table structure 22. The coating film 164 may be formed on an entire surface or a partial surface of the component 162. However, it is preferable to cover at least a portion exposed to the atmosphere in the processing chamber 20 (a portion where the unnecessary thin film 160 (see FIG. 7) may be deposited). As for the coating film 164, it is preferable to use the one having poor adhesivity to the component 162, so that it can be easily peeled off. For example, it is preferable to use a coating film that is easily peeled off by physical impact or a coating film that is easily soluble due to its higher chemical reactivity compared to that of the adhered unnecessary thin film.

Specifically, the coating film 164 may be a thermally sprayed aluminum film, a Teflon (registered trademark) film, a plated film or the like. The component 162 including members such as the edge ring 122, the thermal conduction buffer member 124 and the shield ring 142 is made of a metal such as aluminum, aluminum alloy, stainless steel or the like. Even when the component 162 is made of ceramic such as alumina, aluminum nitride or the like, the coating film 164 can be formed thereon.

After the coating film 164 is formed on the component 162 as described above, the members of the component 162 are attached and assembled to form the mounting table structure 22. In this manner, an attaching step S12 is carried out. As a consequence, the edge ring 122, the thermal conduction buffer member 124 and the shield ring 142 included in the component 162 are assembled to form the complete mounting table structure 22 as shown in FIG. 2.

Thereafter, as described in the aforementioned embodiment, a film forming step is carried out in which a thin film such as a Ru film is formed by supplying a raw material gas into the processing chamber 20 (step S13). As the film forming step S13 is repeated, the unnecessary thin film 160 such as a Ru film is adhered and deposited on the surface of the component 162, as can be seen from FIG. 8B. Further, when the film forming step S13 is performed, the raw material is recovered by simultaneously performing the steps in the first embodiment of the raw material recovery method as described with reference to FIG. 6.

When a predetermined certain amount of the unnecessary thin film 160 is adhered, a separating step S14 is carried out to separate the members of the component 162 such as the edge ring 122, the thermal conduction buffer member 124 and the shield ring 142 by disassembling the mounting table structure 22. Next, a removing step S15 is carried out to remove the unnecessary thin film 160 together with the coating film 164 from the surfaces of the separated members of the component 162. Thereafter, a recovery step S16 is performed to recover the removed unnecessary thin film 160 as shown in FIG. 8C.

In the removing step, the unnecessary thin film 160 and the coating film 164 can be peeled off at the same time by a physical process, e.g., impact of sandblasting. Alternatively, in a case where the coating film 164 is a thermally sprayed aluminum film, a chemical process for dissolving and removing the thermally sprayed aluminum coating film is performed on the thermally sprayed aluminum film by making it react with hydrochloric acid, ammonia, sodium hydroxide since a Ru film has resistance to acid or alkali. Thus, the unnecessary thin film can be peeled off by the chemical process. Another coating film 164 can be formed again on the component 162 from which the coating film 164 has been removed (step S11), and the component 162 is reused.

When the Ru metal which is the unnecessary thin film 160 is recovered, a reproducing step S17 for reproducing $Ru_3(CO)_{12}$ as a raw material is carried out by performing, e.g., a carbonylation process on the Ru metal. Accordingly, the metal contained in the raw material, e.g., Ru, can be effectively recovered at a low cost.

In accordance with the second embodiment of the raw material recovery method, the raw material recovery method in a film forming apparatus for forming a thin film on a surface of a target object to be processed, e.g., a semiconductor wafer W, mounted on a mounting table structure in the vacuum evacuable processing chamber 20 by using a raw material gas containing an organic metal compound includes: forming the coating film 164 on the component 162 (122, 124 and 142) of the mounting table structure; and removing an unnecessary thin film adhered on the component together with the coating film. Hence, the metal contained in the raw material, e.g., Ru, can be effectively recovered at a low coat.

Figure 10:
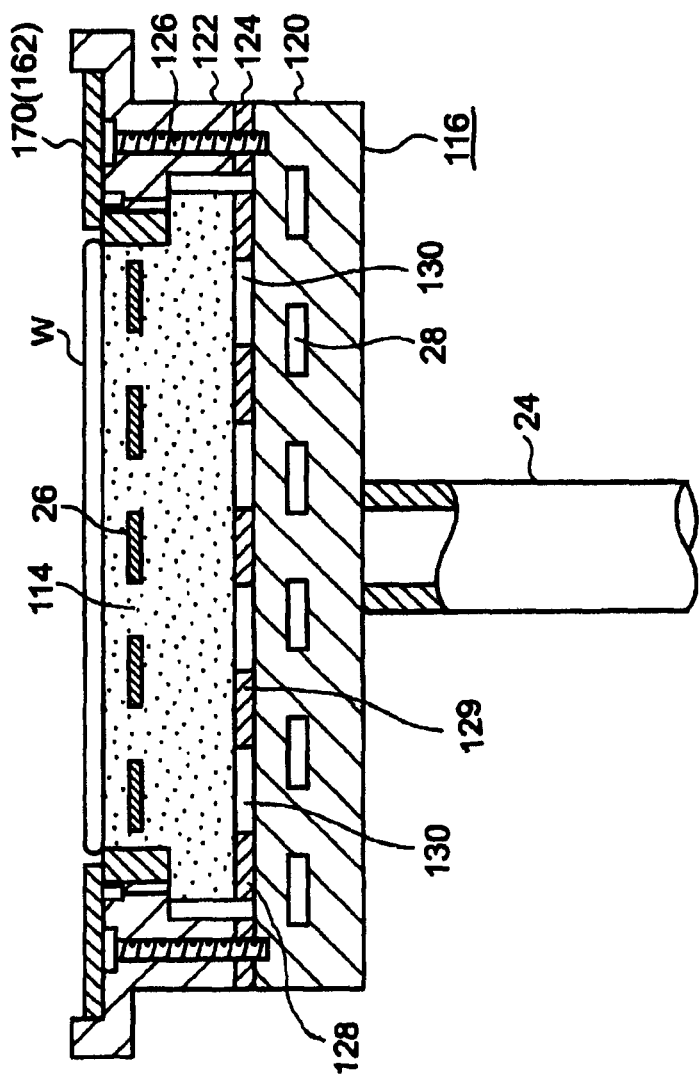
FIG. 10 shows a modification of the first embodiment of the mounting table structure.

Besides, as in a modification of the mounting table structure shown in FIG. 10, a ring-shaped cover ring 170 may be provided on the top surface of the edge ring 122 forming a part of the base 116 in order to prevent adhesion of a film on a bevel portion serving as an end surface (side surface) of the semiconductor wafer W. The cover ring 170 is made of ceramic, e.g., alumina, aluminum nitride or the like, and serves as the detachable component 162. In this case, the cover ring 170 as well as the edge ring 122 is maintained at a temperature higher than the solidification temperature or the liquefaction temperature of the raw material gas, but lower than the decomposition temperature of the raw material gas during the film formation.

However, in view of the temperature uniformity of the wafer, the temperature of the cover ring 170 may be maintained at a medium temperature equal to or higher than the decomposition temperature of the raw material gas. In FIG. 10, like reference numerals are given to like parts illustrated in FIG. 2. As the film forming process is repeatedly performed, an unnecessary thin film may be adhered on the cover ring 170. Therefore, it is preferable to form the coating film 164 described with reference to FIGS. 8A to 8C on the cover ring 170.

In the second embodiment of the raw material recovery method, the case in which the detachable component 162 is cooled by the coolant flowing in the coolant path 28 has been described as an example. However, it is not limited thereto. For example, the coating film 164 of the second embodiment of the method may be applied to detachable component 162 of a mounting table structure having no cooling mechanism.

In the above embodiments, the raw material is solid, so that the coolant and the raw material gas are in contact with each other directly in the main trap mechanism 76. However, when the raw material is liquid, it is preferable to employ a configuration in which the raw material gas is cooled by circulating a coolant in a cooling pipe while the coolant and the raw material gas are not in contact with each other such that the coolant and the raw material gas are not mixed with each other when the raw material gas is reliquefied.

Figure 11:
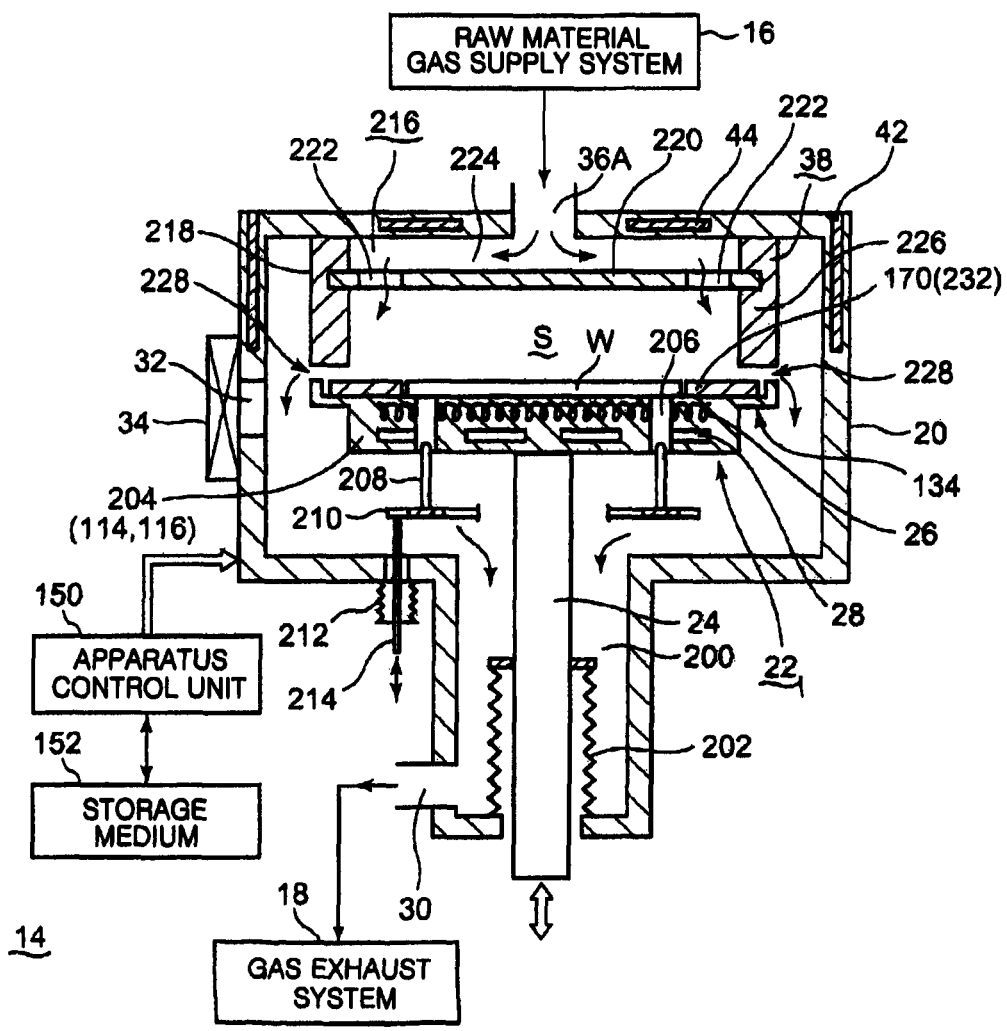
FIG. 11 is a schematic cross sectional view showing a film forming apparatus main body used in a second embodiment of the film forming apparatus in accordance with the present invention.
Figure 12:
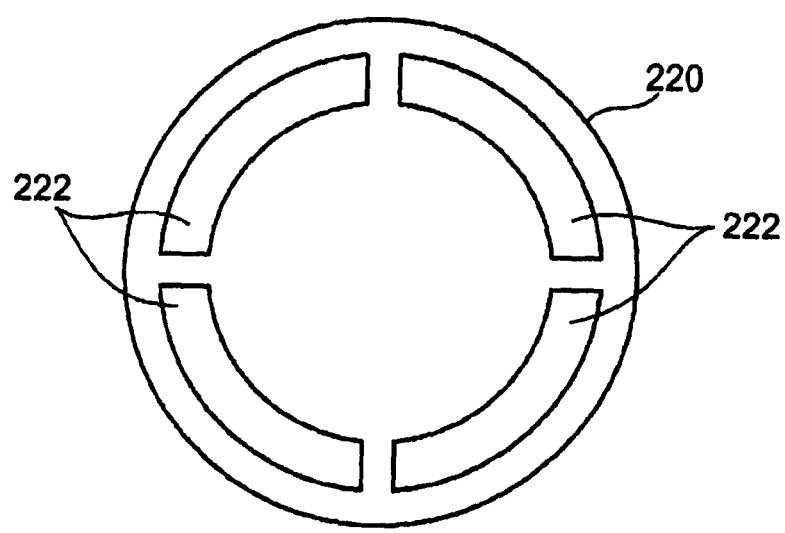
FIG. 12 is a top view showing an example of a baffle plate used in the film forming apparatus main body.
Figure 13:
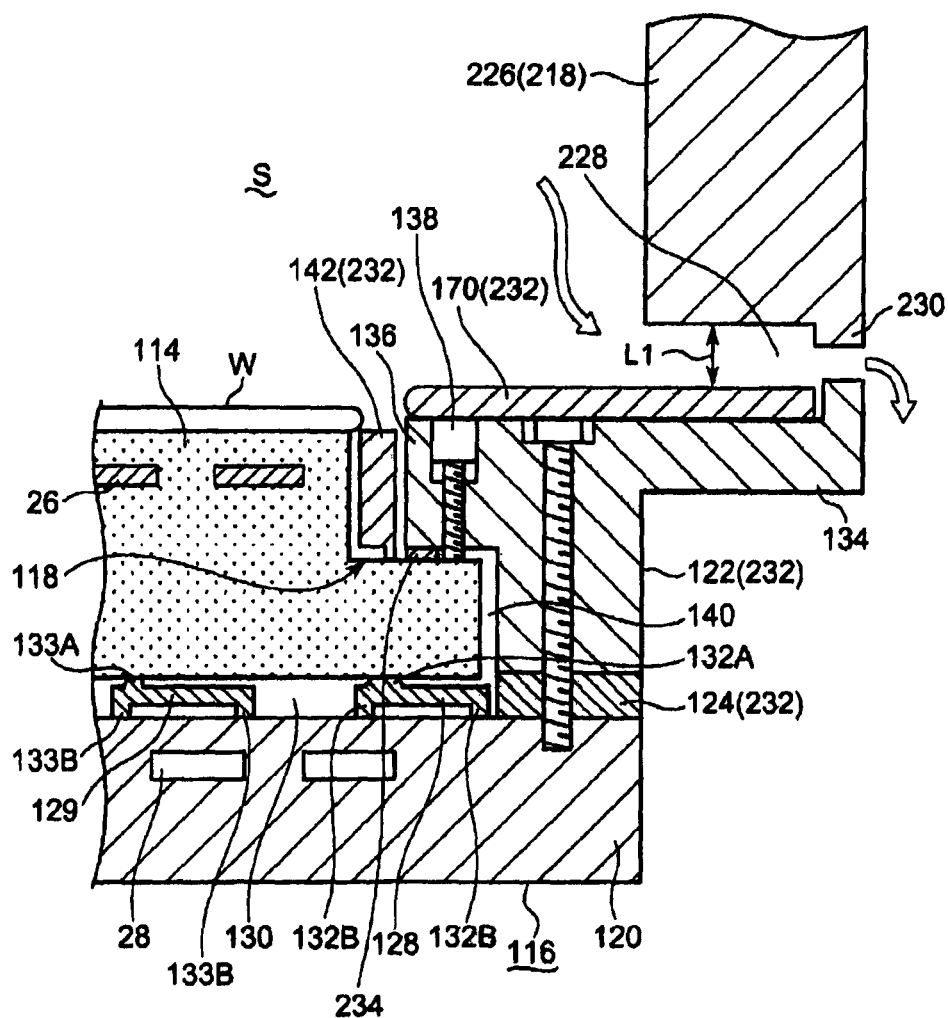
FIG. 13 is a partially enlarged cross sectional view showing a second embodiment of the mounting table structure in accordance with the present invention.

Second Embodiment of Film Forming Apparatus and Second Embodiment of Mounting Table Structure Hereinafter, a second embodiment of the film forming apparatus in accordance with the present invention will be described. FIG. 11 is a schematic cross sectional view showing a film forming apparatus main body used in the second embodiment of the film forming apparatus in accordance with the present invention. FIG. 12 is a top view showing an example of a baffle plate used in the film forming apparatus main body. FIG. 13 is a partially enlarged cross sectional view showing a second embodiment of the mounting table structure in accordance with the present invention. In these drawings, like reference numerals will be given to like parts illustrated in FIGS. 1 to 10, and redundant description thereof is omitted.

In the aforementioned embodiment, the members of the component of the mounting table structure, e.g., the base portion 120, the edge ring 122, the thermal conduction buffer member 124, and the cover ring 170, except the mounting table main body 114 and the shield ring 142 are set to a temperature higher than the solidification temperature or the liquefaction temperature of the raw material gas, but lower than the decomposition temperature of the raw material gas, to thereby prevent the adhesion of the unnecessary thin film 160 thereon.

On the other hand, in the second embodiment of the film forming apparatus, the peripheral component including members such as the edge ring 122 and the cover ring 170 except the base portion 120, is set to a temperature equal to or higher than the decomposition temperature of the raw material gas. Moreover, in order to recover the raw material, an unnecessary thin film is made to be actively deposited on a surface of the peripheral component.

First of all, the film forming apparatus main body 14 will be described with reference to FIG. 11. The processing chamber 20 includes an upper chamber having a large inner diameter and a lower chamber having a small inner diameter. The space in the lower chamber serves as a gas exhaust space 200. A gas exhaust port 30 is formed at a lower sidewall for defining the lower chamber serving as the gas exhaust space 200, and is connected to the above-described gas exhaust system 18. A support 24 of the mounting table structure 22 of the second embodiment extends downward while penetrating the bottom portion of the lower chamber for also defining the gas exhaust space and is connected to an actuator (not shown). Therefore, the entire mounting table structure 22 can be moved vertically and stopped at a random position. An extensible and contractible bellows 202 made of a metal is disposed at the portion of the bottom of the lower chamber where the support 24 penetrates. Accordingly, the mounting table structure 22 can be vertically moved while maintaining the airtightness in the processing chamber 20.

In addition, a plurality of, e.g., three (two are shown in the illustrated example) pin insertion through holes 206 is formed at the peripheral portion of the mounting table 204 including the base 116 and the mounting table main body 114. The lifter pins 208 are inserted in the pin insertion through holes 206 to pass therethrough. The lower end portions of the lifter pins 208 are supported by an elevation arm 210. The elevation arm 210 can be moved vertically in connection with an elevation rod 214 that airtightly penetrates the bottom portion of the upper chamber via the bellows 212. Accordingly, in a state where the mounting table 204 is lowered to the transport position of the wafer W, the lifter pins 208 can protrude from the top surface of the mounting table 204 and raise or lower the wafer W. Furthermore, an opening 32 and a gate valve 34 are formed at a sidewall of the chamber which corresponds to the horizontal level of the top surface of the mounting table 204 that has been lowered.

The gas inlet 36A connected to the raw material gas supply system 16 or a gas supply system for supplying another required gas is formed at the center portion of the ceiling portion of the processing chamber 20. The gas introduction unit 38 communicates with the gas inlet 36A, and has the configuration described in, e.g., Japanese Patent Application Publication No. 2009-239104. The gas introduction unit 38 supplies a raw material gas to a diametrically outer side of the semiconductor wafer W mounted on the mounting table structure 22. In other words, a gas introduction portion 216 is configured such that the raw material gas flows toward a gas exhaust outlet to be described later without being directed toward the wafer W. Specifically, the gas introduction portion 216 is formed by a cylindrical inner partition wall 218 having an inner diameter greater than the diameter of the wafer W, and a baffle plate 220 provided in the inner partition wall 218. The inner partition wall 218 is attached to the ceiling surface of the chamber, and the baffle plate 220 is attached to the inner upper portion of the cylindrical inner partition wall 218 so as to face the wafer W.

As illustrated in FIG. 12, a plurality of circular arc-shaped openings 222 is formed at the circumferential edge of the baffle plate 220 along the circumferential direction thereof. Therefore, the space above the baffle plate 220 serves as a diffusion space 224 where the raw material gas is diffused, and the raw material gas flows or is injected through the openings 222 toward the processing space S disposed therebelow. In this case, the openings 222 are formed at an outer side than the outer periphery of the wafer W on the mounting table 204. In other words, the region directly below the openings 222 is located at the outer side than the outer periphery of the wafer W. Since the raw material gas is supplied to the outer region of the outer periphery of the wafer W without being supplied directly to the top surface of the wafer W, the in-plane uniformity of the film thickness on the wafer W can be ensured.

Instead of the openings 222, a plurality of gas injection holes having a small inner diameter may be formed at substantially the same positions. The inner partition wall 218 or the baffle plate 220 is made of a metal having a good thermal conductivity, e.g., aluminum or aluminum alloy. Further, the inner partition wall 218 serves as a gas outlet forming part 226. In other words, the gas outlet forming part 226 corresponding to the inner partition wall 218 extends downward and becomes close at its lower end to an upper peripheral edge portion of the mounting table 204. This results in formation of a gas exhaust outlet 228.

The gas exhaust outlet 228 is formed in an annular shape along the circumferential direction of the mounting table 204. The flow path is reduced by the gas exhaust outlet 228, so that the raw material gas is uniformly exhausted from the outer peripheral side of the wafer W. More specifically, the gas outlet forming part 226 for defining the gas exhaust outlet 228 is positioned above a flange portion 134 and the cover ring 170 positioned at the peripheral edge of the mounting table 204, and the gas exhaust outlet 228 is formed between the top surface of the cover ring 170 (including a part of the top surface of the flange portion 134) and the lower end surface of the gas outlet forming part 226. In order to further reduce the width of the flow path formed at the outer peripheral side of the gas exhaust outlet 228, a ring-shaped protrusion 230 is formed at the lower end portion of the gas outlet forming part 226 along the circumferential direction thereof. A vertical width L1 of the gas exhaust outlet 228 is set to be within a range between about 1 and 10 mm, e.g., about 2 mm.

The second embodiment of the mounting table structure is characterized in that the peripheral component 232, detachably provided at the outer side of the mounting table main body 114 so as to surround the mounting table main body 114, are set to a temperature equal to or higher than the decomposition temperature of the raw material gas during the thin film formation. The peripheral component 232 corresponds to the component e provided at the outer side of the mounting table main body 114 in the first embodiment. Here, the peripheral component 232 includes the shield ring 142, the edge ring 122 forming a part of the base 116, and the cover ring 170.

In the first embodiment, the temperature of the component is set to a low level in order to prevent an unnecessary thin film from being deposited on the edge ring 122 or the cover ring 170 (see FIG. 10).

On the other hand, in the second embodiment, the temperature of the component is set to a high level, as described above. To do so, a thermal conduction facilitation member 234 for improving thermal conductivity between the mounting table main body 114 and the edge ring 122 is provided at a part of the space 140 between the outer peripheral surface of the mounting table main body 114 and the inner peripheral surface of the edge ring 122 while being in contact with the mounting table main body 114 and the edge ring 122. The thermal conduction facilitation member 234 is formed in, e.g., a ring shape, along the circumferential direction of the mounting table main body 114, and the edge ring 122 made of aluminum or the like is set to a high temperature which is substantially the same as the temperature of the mounting table main body 114 that is equal to or higher than the decomposition temperature of the raw material gas during the film formation.

As a result, the temperature of the cover ring 170 made of ceramic such as alumina or the like which is mounted on the edge ring 122 is set to a high temperature substantially the same as that of the edge ring 122. The shield ring 142 is in direct contact at its lower end portion with the mounting table main body 114, and thus has a temperature substantially the same as that of the mounting table main body 114. The thermal conduction facilitation member 234 may be made of a metal having a good thermal conductivity, such as alumina, aluminum alloy or the like. If a protrusion is provided at the same portion as the installation portion of the thermal conduction facilitation member 234 on the mounting table main body 114 or the edge ring 122, the mounting table main body 114 and the edge ring 122 contact with each other directly and, hence, it is not required to provide the thermal conduction facilitation member 234.

The thermal conduction facilitation member 234 can be formed anywhere in the space 140, and the installation position thereof is not limited particularly. Although the case in which the cover ring 170 is provided has been described in the above, the cover ring 170 may not be provided as described in the first embodiment. Alternatively, another peripheral component may be provided in addition to the cover ring 170. The present embodiment can be applied to any of these cases.

Third Embodiment of Raw Material Recovery Method

Figure 14:
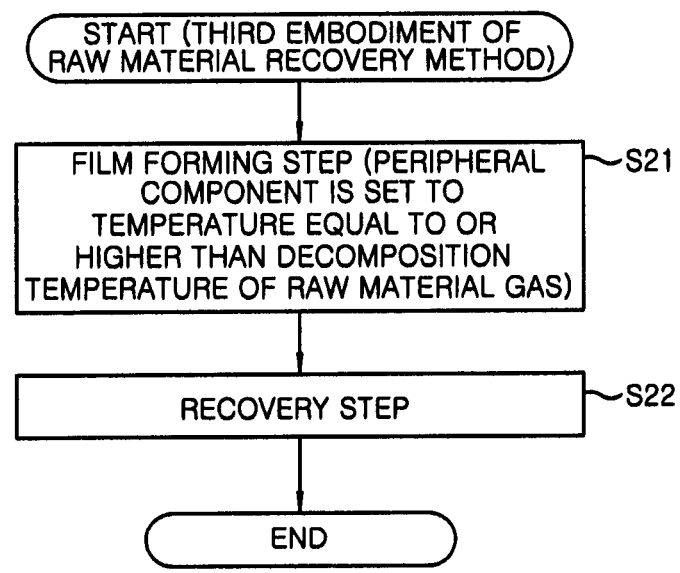
FIG. 14 is a flowchart showing a third embodiment of the raw material recovery method in accordance with the present invention.

Hereinafter, a third embodiment of the raw material recovery method in accordance with the present invention that is performed by using the second embodiment of the film forming apparatus 12 configured as described above will be explained with reference to FIG. 14. FIG. 14 is a flowchart showing the third embodiment of the raw material recovery method in accordance with the present invention. This raw material recovery method is basically the same as the method described with reference to the flowchart shown in FIG. 6 except that the temperature of the peripheral component 232 is different. First of all, the semiconductor wafer W supported by the mounting table main body 22 is maintained at a predetermined temperature by the heater 26. The sidewall of the processing chamber 20, or the inner partition wall 218 and the baffle plate 220 forming the gas introduction unit 38 are maintained at another predetermined temperature by the heaters 42 and 44. The latter predetermined temperature is higher than the solidification temperature or the liquefaction temperature of the raw material gas, but lower than the decomposition temperature of the raw material gas, which is, e.g., about 80° C.

The raw material gas generated by the raw material gas supply system 16 is introduced together with the carrier gas through the gas inlet 36A of the film forming apparatus main body 14 into the diffusion space 224 forming the gas introduction portion 216 of the gas introduction unit 38, and then is diffused therein. Thereafter, the raw material gas flows downward through the openings 222 formed at the peripheral portion of the baffle plate 220, and then is introduced into the processing space S set in the depressurized atmosphere.

In the processing space S, the raw material gas flows toward the central portion of the wafer W in a state where a part thereof is diffused. Since, however, the atmosphere in the processing space S is uniformly discharged to the outside through the annular gas exhaust outlet 228 provided above the peripheral edge of the mounting table 204, a Ru metal thin film is more uniformly formed on the semiconductor wafer W in the processing chamber 20 by, e.g., CVD (Chemical Vapor Deposition). In this manner, a film forming step S21 shown in FIG. 14 is carried out. At this time, the processing conditions are the same as those of the first embodiment. In other words, the processing pressure is set to about 0.1 Torr (13.3 Pa), and the temperature of the semiconductor wafer is set to a temperature equal to or higher than the decomposition temperature of the raw material gas, which is in a range of, e.g., about 150 to 250° C.

At this time, unlike the first embodiment, the thermal conduction of the peripheral component 232 including the edge ring 122 and the cover ring 170 is facilitated by the thermal conduction facilitation member 234 provided at the space 140. Accordingly, the peripheral component 232 is set to a high temperature substantially the same as that of the mounting table main body 114 in a range between, e.g., about 190 and 230° C. As a result, a Ru film is deposited on the surface of the edge ring 122 or the cover ring 170 as well as on the surface of the wafer W.

Especially, since the atmosphere in the processing space S is discharged through the gas exhaust outlet 228 having a reduced flow path area, the raw material gas that does not contribute to the film formation on the wafer W is actively heated by the shield ring 142 or the edge ring 122, which are heated to a high temperature, while passing through the gas exhaust outlet 228. Accordingly, most of the raw material gas is thermally decomposed and deposited as a Ru film on the surface of the shield ring 142 or the edge ring 122. Further, the Ru film deposited on the surface of the peripheral component 232 is separated from the processing chamber 20 and recovered, as will be described later.

On the other hand, the gas outlet forming part 226 positioned above the flange portion 134 is set to, e.g., about 80° C., which is lower than the decomposition temperature of the raw material gas, so that a Ru film is hardly adhered on the surface of the gas outlet forming part 226. Further, as in the first embodiment, most of the unreacted raw material gas in the exhaust gas discharged from the processing chamber 20 toward the gas exhaust system 18 is recovered in the auxiliary trap mechanism 74 and the main trap mechanism. Then, a recovery step S22 shown in FIG. 14 is carried out. However, in the present embodiment, most of the raw material gas is decomposed and consumed in the processing chamber 20, as described above. Therefore, the amount of the raw material recovered in the trap mechanisms 74 and 76 is considerably small. Further, the load of the trap mechanisms 74 and 76 can be reduced, and the frequency of the maintenance can be decreased. In addition, the load of the gas exhaust system 18 can be reduced.

Fourth Embodiment of Raw Material Recovery Method

Figure 15:
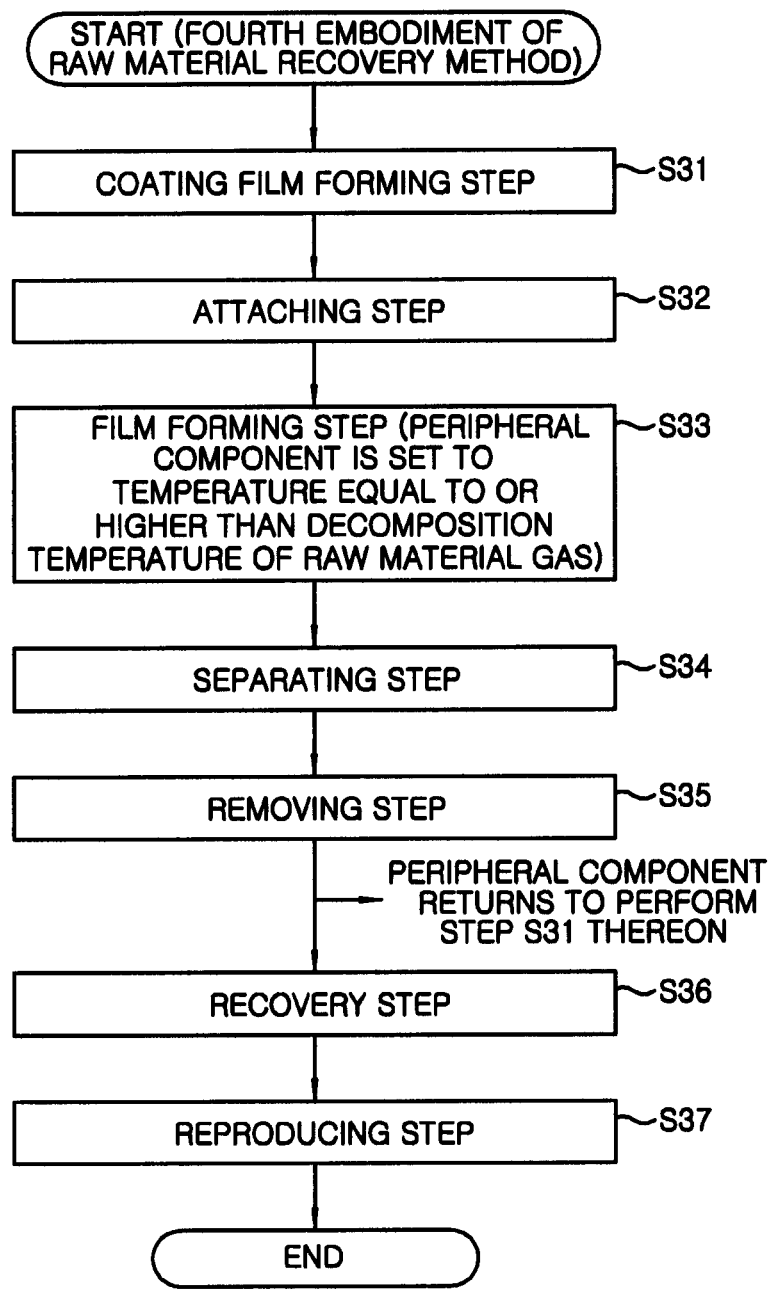
FIG. 15 is a flowchart showing a fourth embodiment of the raw material recovery method in accordance with the present invention.
Figure 16:
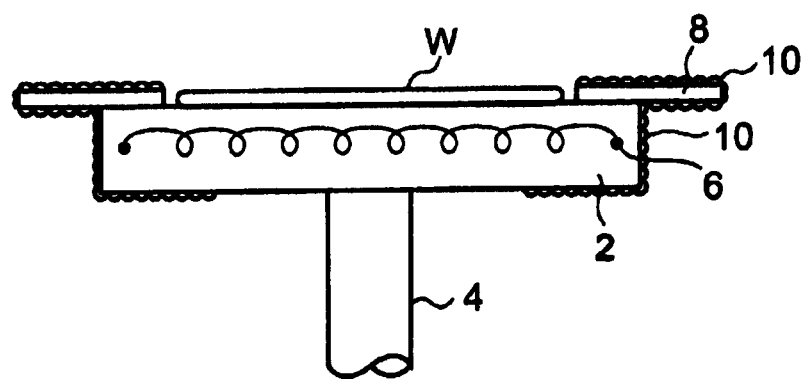
FIG. 16 is a schematic view showing a part of a conventional mounting table structure provided in a film forming apparatus.

In a fourth embodiment of the raw material recovery method as well as the second embodiment of the raw material recovery method, a coating film to be removed later is formed in advance on the peripheral component 232 and, then, an unnecessary thin film is adhered on the coating film, to thereby easily perform a metal recovery process. FIG. 15 is a flowchart showing the fourth embodiment of the raw material recovery method in accordance with the present invention. The changes in the peripheral component having the coating film are the same as those described in FIGS. 8A to 8C. Here, "the peripheral component" is used instead of "the component". The fourth embodiment of the raw material recovery method is the same as the second embodiment shown in FIG. 9 except that the temperature of the peripheral component in the film forming step is set to a temperature equal to or higher than the decomposition temperature of the raw material gas. In other words, the steps S31 to S37 correspond to the steps S11 to S17 shown in FIG. 9.

Before the film forming process is performed, the peripheral component 232 among the detachable components of the mounting table structure 22, i.e., the exchangeable peripheral component 232, is separated and, then, the coating film 164 is formed on the surface of the peripheral component 232 as shown in FIG. 8A. In this manner, a coating film forming step is carried out (step S31 shown in FIG. 15).

Here, the detachable peripheral component 232 includes the edge ring 122, the shield ring 142 and the cover ring 170 of the mounting table structure 22. The coating film 164 may be formed on an entire surface or a partial surface of the peripheral component 232. However, it is preferable to cover at least a portion exposed to the atmosphere in the processing chamber 20 (a portion where the unnecessary thin film 160 (see FIG. 7) may be deposited). As for the coating film 164, it is preferable to use the one having poor adhesivity to the peripheral components 232, so that it can be easily peeled off. For example, it is preferable to use a coating film that is easily peeled off by physical impact, or a coating film that is easily soluble due to its higher chemical reactivity compared to that of the adhered unnecessary thin film.

Specifically, the coating film 164 may be a thermally sprayed aluminum film, a Teflon (registered trademark) film, a plated film or the like. The peripheral component 232 including members such as the edge ring 122, the shield ring 142, and the cover ring 170 is made of a metal such as aluminum, aluminum alloy, stainless steel or the like. Even when the peripheral component 232 is made of ceramic such as alumina, aluminum nitride or the like, the coating film 164 can be formed thereon.

After the coating film 164 is formed on each of the peripheral component 232 as described above, the members of the peripheral component 232 are attached and assembled to form the mounting table structure 22. In this manner, an attaching step S32 is carried out. As a consequence, the complete mounting table structure 22 can be obtained as shown in FIG. 11.

Next, as described in the third embodiment of the raw material recovery method, a film forming step is carried out in which a thin film such as a Ru film is formed by supplying a raw material gas into the processing chamber 20 (step S33). In this film forming step, the peripheral component 232 including the edge ring 122, the shield ring 142 and the cover ring 170 is set to a temperature equal to or higher than the decomposition temperature of the raw material gas, as described in the third embodiment of the raw material recovery method. Hence, the Ru film is formed on the surface of the peripheral component 232. As the film forming step S33 is repeated, the unnecessary thin film 160 such as a Ru film having a certain thickness is adhered and deposited on the surface of the peripheral component 162. Further, when the film forming step S33 is performed, the raw material is recovered by simultaneously performing the steps in the third embodiment of the raw material recovery method as described in the above with reference to FIG. 14.

When a predetermined certain amount of the unnecessary thin film 160 is adhered, a separating step S34 is carried out to separate the members of the peripheral component 232 such as the edge ring 122, the shield ring 142, and the cover ring 170 by disassembling the mounting table structure 22. Next, a removing step S35 is carried out to remove the unnecessary thin film 160 together with the coating film 164 from the surfaces of the separated members of the peripheral component 232. Thereafter, a recovery step S36 is performed to recover the removed unnecessary thin film 160 as shown in FIG. 8C.

In the removing step, the unnecessary thin film 160 and the coating film 164 can be peeled off at the same time by a physical process, e.g., impact of sandblasting, as described in the recovery step S16 shown in FIG. 9. Alternatively, in a case where the coating film 164 is a thermally sprayed aluminum film, a chemical process for dissolving and removing the thermally sprayed aluminum coating film is performed on the thermally sprayed aluminum film by making it react with hydrochloric acid, ammonia, sodium hydroxide since a Ru film has resistance to acid or alkali. Thus, the unnecessary thin film can be peeled off by the chemical process. Another coating film 164 can be formed again on the peripheral component 232 from which the coating film 164 has been removed (step S31), and the peripheral component 232 is reused.

When the Ru metal which is the unnecessary thin film 160 is recovered, a reproducing step S37 for reproducing $Ru_3(CO)_{12}$ as a raw material is carried out by performing, e.g., a carbonylation process, on the Ru metal. Hence, the metal contained in the raw material, e.g., Ru, can be effectively recovered at a low cost.

In accordance with the fourth embodiment of the raw material recovery method, the raw material recovery method in a film forming apparatus for forming a thin film on a surface of a target object to be processed, e.g., a semiconductor wafer W, mounted on a mounting table structure in the vacuum evacuable processing chamber 20 by using a raw material gas containing an organic metal compound includes: forming a mounting table structure by attaching the peripheral component 232 (122, 142 and 170) to the mounting table main body 114 having the heater 26 while surrounding the outer peripheral side of the mounting table main body 114; forming a thin film on the surface of the target object mounted on the mounting table structure having the peripheral component in a state where the target object and the peripheral component are maintained at a temperature equal to or higher than the decomposition temperature of the raw material gas; separating the peripheral component from the mounting table structure after the film forming step; removing the thin film adhered on the peripheral component; and recovering the metal contained in raw material from the removed thin film. Hence, the metal contained in the raw material can be effectively removed at a low cost from the unnecessary thin film deposited on the surface of the peripheral component and, also, the load of the gas exhaust system can be reduced.

(Examination Result)

Here, the examination was executed by performing the fourth embodiment of the raw material recovery method. The following is description of the examination result. As a result of the Ru film formation performed under the above-described processing conditions, 19% of the raw material was deposited on the wafer surface; about 77% (about 80%) of the raw material was deposited on the peripheral component 232; and 3% of the raw material was discharged to the gas exhaust system together with the exhaust gas. Among the raw material deposited on the peripheral component 232, 4% was deposited on the shield ring 142; 7% was deposited on the edge ring 122; and 66% was deposited on the cover ring 170. As such, about 77% of the raw material was able to be recovered from the peripheral components 232. In other words, the remarkable effects of the fourth embodiment of the raw material recovery method were proved.

In the raw material recovery method shown in FIG. 15, the case of forming the coating film 164 on the peripheral component 232 in the step S31 has been described as an example. However, it is not limited thereto, and the film forming process may also be performed by assembling the peripheral component 232 having no coating film 164 in the processing chamber 20.

In the film forming apparatus shown in FIG. 11, the gas outlet forming part 226 is set to, e.g., about 80° C., which is lower than the decomposition temperature of the raw material gas. However, the temperature of the lower end portion of the gas outlet forming part 226 during the film formation may be set to be equal to or higher than the decomposition temperature of the raw material gas by providing a thermal insulation member at a longitudinally intermediate portion of the gas outlet forming part 226. Accordingly, a Ru film is deposited on the surface of the lower end portion of the gas outlet forming part 226. By recovering the Ru film from the lower end portion of the gas outlet forming part 226, the recovery efficiency of the raw material can be improved by the corresponding amount.

In the film forming apparatus shown in FIG. 11, the case in which the baffle plate 220 is used as the gas introduction unit 38 has been described as an example. However, it is not limited thereto, and the present embodiment may also be applied to the apparatus using the gas nozzle or the shower head 36 shown in FIG. 1. Besides, an unnecessary thin film, e.g., a Ru film, can be deposited on the peripheral component by applying the mounting table structure of the second embodiment described in FIG. 11 to the film forming apparatus shown in FIG. 1. In this case, the gas exhaust outlet 228 is not provided, so that the amount of the raw material recovered in the processing chamber 20 is slightly smaller than that obtained in the film forming apparatus shown in FIG. 11.

In the above-described embodiments, as for the organic metal compound of the raw material, it is possible to use a material selected from the group including Ru$_3$(CO)$_{12}$, W(CO)$_6$, Ni(CO)$_4$, MO(CO)$_6$, CO$_2$(CO)$_8$, Rh$_4$(CO)$_{12}$, Re$_2$(CO)$_{10}$, Cr(CO)$_6$, Os$_3$(CO)$_{12}$, Ta(CO)$_5$, TEMAT (Tetrakis(ethylmethylamino)titanium), TAIMATA, Cu(EDMDD)$_2$, TaCl$_5$, TMA (TriMethyl aluminum), TBT-DET (TertiaryButylimido-Tris-Diethylamino Tantalum), PET (Pentakis(ethoxy) Tantalum), TMS (Tetramethyl Silane), TEH (Tetrakis(ethoxy)hafnium), Cp$_2$Mn[=Mn(C$_5$H$_5$)$_2$], (MeCp)$_2$Mn[=Mn(CH$_3$C$_5$H$_4$)$_2$], (EtCp)$_2$Mn[=Mn(C$_2$H$_5$C$_5$B$_4$)$_2$], (i-PrCp)$_2$Mn[=Mn(C$_3$H$_5$H$_4$)$_2$], MeCpMn(CO)$_3$[=(CH$_3$C$_5$H$_4$)Mn(CO)$_3$], (t-BUCP)$_2$Mn[=Mn(C$_4$H$_9$C$_5$H$_4$)$_2$], CH$_3$Mn(CO)$_5$, Mn(DPM)$_3$[=Mn(C$_{11}$H$_{19}$O$_2$)$_3$], Mn(DMPD) (EtCp) [=Mn(C$_7$H$_{11}$C$_2$H$_5$C$_5$H$_4$)], Mn(acac)$_2$[=Mn(C$_5$H$_7$O$_2$)$_2$], Mn(DPM)$_2$[=Mn(C$_{11}$H$_{19}$O$_2$)$_2$], and Mn(acac)$_3$[=Mn(C$_5$H$_7$O$_2$)$_3$].

Although a semiconductor wafer has been described as an example of a target object to be processed in the above, the semiconductor wafer may be a silicon substrate, or a compound semiconductor substrate such as GaAs, SiC, GaN or the like. Furthermore, the present invention can also be applied to a ceramic substrate or a glass substrate used for a liquid crystal display other than the above substrates.

What is claimed is:

1. A mounting table structure for use in forming a thin film on a surface of a target object mounted on the mounting table structure by using a raw material gas including an organic metal compound in a vacuum evacuable processing chamber, the mounting table structure comprising:
    a mounting table main body which mounts thereon the target object and has therein a heater;
    a plurality of thermal insulators; and
    a base which supports the mounting table main body via the thermal insulators while surrounding a side surface and a bottom surface of the mounting table main body, the base having therein a coolant path where a coolant flows therethrough, wherein the base is configured to be maintained at a temperature higher than a solidification temperature or a liquefaction temperature of the raw material gas, but lower than a decomposition temperature of the raw material gas,
    wherein the base includes:
    a circular plate-shaped base portion, made of a metal, which has therein the coolant path and supports the mounting table main body via the thermal insulators provided between a top surface of the base portion and the bottom surface of the mounting table main body; and
    an edge ring, made of a metal, which stands upright on a peripheral edge of the base portion so as to surround the side surface of the mounting table main body and is coupled to the base portion as one unit,
    wherein a thermal conduction buffer member is provided between the base portion and the edge ring, the thermal conduction buffer member being made of a metal having a thermal conductivity lower than a thermal conductivity of the metal forming the edge ring,
    wherein a space exists between an inner peripheral surface of the edge ring and the side surface of the mounting table main body,
    wherein a shield ring is detachably provided between the side surface of the mounting table main body and the inner peripheral surface of the edge ring,
    wherein a plurality of spaces exists between the thermal insulators, and
    wherein each of the thermal insulators has a support protrusion at an upper portion thereof and leg portions at a lower portion thereof, the support protrusion being in contact with the bottom surface of the mounting table main body and the leg portions being in contact with the top surface of the base portion.

2. The mounting table structure of claim 1, wherein the base portion and the edge ring are detachably coupled to each other by bolts.

3. The mounting table structure of claim 1 or 2, wherein a top surface of the edge ring extends by a predetermined distance toward a diametrically outer side of the target object.

4. The mounting table structure of claim 1, wherein a cover ring for suppressing formation of a thin film on a side surface of the target object is provided on the edge ring.

5. The mounting table structure of claim 4, wherein a coating film is formed on a surface of the cover ring.

6. The mounting table structure of claim 1, wherein a coating film is formed on a surface of the edge ring.

7. The mounting table structure of claim 1, wherein a coating film is formed on a surface of the shield ring.

8. The mounting table structure of any one of claims 5 to 7, wherein the coating film is one of a thermally sprayed metal film and a plated film.

9. The mounting table structure of claim 1, wherein the base is supported by a support standing upright on a bottom portion of the processing chamber.

10. A film forming apparatus for performing a film forming process for forming a thin film on a surface of a target object by using a raw material gas including an organic metal compound, the film forming apparatus comprising:
    a vacuum evacuable processing chamber;
    the mounting table structure of claim 1, for mounting thereon the target object;
    a gas introduction unit for introducing a gas into the processing chamber;
    a raw material gas supply system, connected to the gas introduction unit, for supplying the raw material gas;
    a gas exhaust system for exhausting the atmosphere in the processing chamber;
    a trap mechanism for collecting and recovering an unreacted raw material gas in an exhaust gas flowing in the gas exhaust system, and
    a control unit configured to control the coolant to maintain the base at a temperature higher than a solidification temperature or a liquefaction temperature of the raw material gas, but lower than a decomposition temperature of the raw material gas.

11. The film forming apparatus of claim 10, wherein the trap mechanism solidifies and recovers the raw material gas.

12. The film forming apparatus of claim 10, wherein a gas outlet forming part forming a gas exhaust outlet is provided in the processing chamber such that a lower end portion thereof is positioned close to an upper peripheral edge portion of the mounting table structure.

13. The film forming apparatus of claim 12, wherein the gas exhaust outlet is formed in an annular shape along a circumferential direction of the mounting table structure.

14. The film forming apparatus of claim 12, wherein a gas introduction unit for supplying the raw material gas to be directed toward the gas exhaust outlet is provided at a diametrically outer side of the target object mounted on the mounting table structure in the processing chamber.

15. The film forming apparatus of claim 12, wherein the gas outlet forming part is positioned above the mounting table structure.

16. The film forming apparatus of claim 15, wherein the gas exhaust outlet is formed between the upper peripheral edge portion of the mounting table structure and the lower end portion of the gas outlet forming part.

17. The film forming apparatus of claim 15, wherein a ring-shaped protrusion is formed at the lower end portion of the gas outlet forming part along a circumferential direction thereof.

18. The film forming apparatus of claim 12, wherein the gas exhaust outlet is formed between the upper peripheral edge portion of the mounting table structure and the lower end portion of the gas outlet forming part.

19. The film forming apparatus of claim 18, wherein a ring-shaped protrusion is formed at the lower end portion of the gas outlet forming part along a circumferential direction thereof.

20. The film forming apparatus of claim 12, wherein a ring-shaped protrusion is formed at the lower end portion of the gas outlet forming part along a circumferential direction thereof.

21. A mounting table structure for use in forming a thin film on a surface of a target object mounted on the mounting table structure by using a raw material gas including an organic metal compound in a vacuum evacuable processing chamber, the mounting table structure comprising:
 a mounting table main body which mounts thereon the target object and has therein a heater;
 a plurality of thermal insulators;
 a circular plate-shaped base portion, made of a metal, which supports the mounting table main body via the thermal insulators and has therein a coolant path where a coolant flows therethrough; and
 a peripheral component which is detachably provided at an outer peripheral side of the mounting table main body so as to surround the mounting table main body, wherein the peripheral component is configured to be maintained at a temperature equal to or higher than a decomposition temperature of the raw material gas during thin film formation,
 wherein the thermal insulators are provided between a top surface of the base portion and a bottom surface of the mounting table main body,
 wherein an edge ring, made of a metal, stands upright on a peripheral portion of the base portion so as to surround a side surface of the mounting table main body,
 wherein the edge ring forms a part of the peripheral component,
 wherein a thermal conduction buffer member is provided between the base portion and the edge ring, the thermal conduction buffer member being made of a metal having a thermal conductivity lower than a thermal conductivity of the metal forming the edge ring,
 wherein the mounting table main body and the edge ring are in contact with each other directly or partially through a thermal conduction facilitation member in order to improve a thermal conductivity therebetween,
 wherein a space exists between an inner peripheral surface of the edge ring the side surface of the mounting table main body,
 wherein a shield ring is detachably provided between the side surface of the mounting table main body and the inner peripheral surface of the edge ring, and forms a part of the peripheral component,
 wherein a plurality of spaces exists between said plurality of the thermal insulators, and
 wherein each of the thermal insulators has a support protrusion at an upper portion thereof and leg portions at a lower portion thereof, the support protrusion being in contact with the bottom surface of the mounting table main body and the leg portions being in contact with the top surface of the base portion.

22. The mounting table structure of claim 21, wherein the base portion and the edge ring are detachably coupled to each other by bolts.

23. The mounting table structure of claim 21 or 22, wherein a top surface of the edge ring extends by a predetermined distance toward a diametrically outer side of the target object.

24. The mounting table structure of claim 21, wherein a cover ring for suppressing formation of a thin film on a side surface of the target object is provided on the edge ring, and forms a part of the peripheral component.

25. The mounting table structure of claim 24, wherein a coating film is formed on a surface of the cover ring.

26. The mounting table structure of claim 21, wherein a coating film is formed on a surface of the edge ring.

27. The mounting table structure of claim 21, wherein a coating film is formed on a surface of the shield ring.

28. The mounting table structure of any one of claims 25 to 27, wherein the coating film is one of a thermally sprayed metal film and a plated film.

29. The mounting table structure of claim 1 or 21, wherein the base portion is supported by a support standing upright on a bottom portion of the processing chamber.

30. The mounting table structure of claim 1 or 21, wherein the organic metal compound is a material selected from the group consisting of $Ru_3(CO)_{12}$, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Os_3(CO)_{12}$, $Ta(CO)_5$, TEMAT (Tetrakis(ethylmethylamino) titanium), TAIMATA, $Cu(EDMDD)_2$, $TaCl_5$, TMA (TriMethyl aluminum), TBTDET (TertiaryButylimido-Tris-Diethylamino Tantalum), PET (Pentakis(ethoxy) Tantalum), TMS (Tetramethyl Silane), TEH (Tetrakis(ethoxy)hafnium), $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i\text{-}PrCp)_2Mn[=Mn(C_3H_7C_5H_4)_2]$, $MeCpMn(CO)_3[=(CH_3C_5H_4)Mn(CO)_3]$, $(t\text{-}BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, and $Mn(acac)_3[=Mn(C_5H_7O_2)_3]$.

31. A film forming apparatus for performing a film forming process for forming a thin film on a surface of a target object by using a raw material gas including an organic metal compound, the film forming apparatus comprising:
 a vacuum evacuable processing chamber;
 the mounting table structure of claim 21, for mounting thereon the target object;
 a gas introduction unit for introducing a gas into the processing chamber;
 a raw material gas supply system, connected to the gas introduction unit, for supplying the raw material gas;
 a gas exhaust system for exhausting the atmosphere in the processing chamber;
 a trap mechanism for collecting and recovering an unreacted raw material gas in an exhaust gas flowing in the gas exhaust system, and
 a control unit configured to control the heater to maintain the peripheral component at a temperature equal to or higher than a decomposition temperature of the raw material gas during thin film formation.

32. The film forming apparatus of claim 31, wherein the trap mechanism solidifies and recovers the raw material gas.

33. The film forming apparatus of claim 31, wherein a gas outlet forming part forming a gas exhaust outlet is provided in the processing chamber such that a lower end portion thereof is positioned close to an upper peripheral edge portion of the mounting table structure.

34. The film forming apparatus of claim 33, wherein the gas exhaust outlet is formed in an annular shape along a circumferential direction of the mounting table structure.

35. The film forming apparatus of claim 33, wherein a gas introduction unit for supplying the raw material gas to be directed toward the gas exhaust outlet is provided at a diametrically outer side of the target object mounted on the mounting table structure in the processing chamber.

36. The film forming apparatus of claim 33, wherein the gas outlet forming part is positioned above the mounting table structure.

37. The film forming apparatus of claim 36, wherein the gas exhaust outlet is formed between the upper peripheral edge portion of the mounting table structure and the lower end portion of the gas outlet forming part.

38. The film forming apparatus of claim 36, wherein a ring-shaped protrusion is formed at the lower end portion of the gas outlet forming part along a circumferential direction thereof.

39. The film forming apparatus of claim 33, wherein the gas exhaust outlet is formed between the upper peripheral edge portion of the mounting table structure and the lower end portion of the gas outlet forming part.

40. The film forming apparatus of claim 39, wherein a ring-shaped protrusion is formed at the lower end portion of the gas outlet forming part along a circumferential direction thereof.

41. The film forming apparatus of claim 33, wherein a ring-shaped protrusion is formed at the lower end portion of the gas outlet forming part along a circumferential direction thereof.

* * * * *